US012595567B2

(12) United States Patent
Kang et al.

(10) Patent No.: US 12,595,567 B2
(45) Date of Patent: Apr. 7, 2026

(54) SUBSTRATE TREATING APPARATUS AND SUBSTRATE TREATING METHOD

(71) Applicant: SEMES CO., LTD., Chungcheongnam-do (KR)

(72) Inventors: Shin Hwa Kang, Gyeonggi-do (KR); Seung Un Oh, Chungcheongnam-do (KR); Young Ho Park, Incheon (KR); Sang Hyeon Ryu, Gyeonggi-do (KR); Kwang Sup Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 550 days.

(21) Appl. No.: 18/145,138

(22) Filed: Dec. 22, 2022

(65) Prior Publication Data

US 2023/0203669 A1 Jun. 29, 2023

(30) Foreign Application Priority Data

Dec. 28, 2021 (KR) ........................ 10-2021-0189937

(51) Int. Cl.
*C23F 1/08* (2006.01)
*H01L 21/68* (2006.01)

(52) U.S. Cl.
CPC .............. *C23F 1/08* (2013.01); *H01L 21/681* (2013.01)

(58) Field of Classification Search
None
See application file for complete search history.

(56) References Cited

U.S. PATENT DOCUMENTS

| | | | | |
|---|---|---|---|---|
| 6,940,592 | B2* | 9/2005 | Borden | G01N 21/9501 |
| | | | | 250/559.27 |
| 8,123,901 | B2* | 2/2012 | Inada | H01L 21/68 |
| | | | | 156/345.23 |
| 8,551,795 | B2* | 10/2013 | Lee | C23C 16/50 |
| | | | | 118/721 |
| 10,679,883 | B2* | 6/2020 | Bluck | C23C 14/50 |
| 11,504,869 | B2* | 11/2022 | Iida | B23Q 15/26 |

(Continued)

FOREIGN PATENT DOCUMENTS

| | | | | |
|---|---|---|---|---|
| JP | WO 2004003469 A1 * | 10/2005 | ......... | G03F 7/70616 |
| KR | 10-2019-0037479 A | 4/2019 | | |

(Continued)

*Primary Examiner* — Sylvia Macarthur

(74) *Attorney, Agent, or Firm* — Carter, DeLuca & Farrell LLP

(57) ABSTRACT

Disclosed is a method for treating a substrate, on which a plurality of reference marks and a pattern are formed. The method includes a process preparing operation, a location information acquiring operation of acquiring information on an actual location of the pattern, and a process executing operation of supplying a treatment liquid to the substrate, and heating the substrate by irradiating laser light to the pattern on the substrate, to which the treatment liquid is applied, the location information acquiring operation includes acquiring information on actual locations of, among the plurality of reference marks, at least three reference marks, and acquiring information of the actual location of the pattern through the information of the actual locations of the reference marks.

14 Claims, 19 Drawing Sheets

(56) References Cited

U.S. PATENT DOCUMENTS

2010/0231928 A1 * 9/2010 Tanaka .............. H01L 21/67092
                                                    355/72
2019/0378738 A1 * 12/2019 Lee ................... H01L 21/68735
2023/0203669 A1 * 6/2023 Kang ........................ C23F 1/08
                                                    156/345.15

FOREIGN PATENT DOCUMENTS

KR          102046871      * 11/2019
KR          10-2185496 B1   12/2020
WO       WO201455830 A1 * 10/2014

* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2021-0189937 filed on Dec. 28, 2021, in the Korean Intellectual Property Office, the entire contents of which are hereby incorporated by reference.

BACKGROUND

Embodiments of the inventive concept described herein relate to a substrate treating apparatus and a substrate treating method.

To manufacture a semiconductor device, various processes, such as photographing, etching, ashing, injection of ions, and deposition of thin films, are performed on a substrate, such as a wafer. In the processes, various treatment liquids and treatment gases are used. Furthermore, to remove the treatment liquid used to treat the substrate from the substrate, a process of drying the substrate is performed.

The photographing process of forming a pattern on the wafer includes an exposure process. The exposure operation is a preliminary operation for directly shaving off a semiconductor material attached on the wafer into a pattern. The exposure process may have various purposes, such as formation of a pattern for etching and formation of a pattern for injection of ions. In the exposure process, a pattern is drawn on the wafer with light by using a mask that is a kind of frame. When light is directly exposed to a semiconductor material on the wafer, for example, a resist on the wafer, chemical properties of the resist are changed according to a pattern due to the light and the mask. When a development liquid is supplied to the resist, the chemical properties of which are changed according to the pattern, a pattern is formed on the wafer.

To precisely perform the exposure process, the pattern formed on the mask has to be precisely manufactured. To identify whether the pattern has a desired shape and whether the pattern is formed precisely, an operator inspects the formed pattern by using inspection equipment, such as a scanning electronic microscope (SEM). However, because a plurality of patterns are formed in one mask, all of the plurality of patterns have to be inspected to inspect the one mask. Accordingly, much time has to be taken for inspection of the mask.

Accordingly, a monitoring pattern that may represent one pattern group including a plurality of patterns is formed in the mask. Furthermore, an anchor pattern that may represent a plurality of pattern groups is formed in the mask. An operator may estimate qualities of the patterns formed in the mask through inspection of the anchor pattern. Furthermore, the operator may estimate qualities of the patterns included in one pattern group through inspection of the monitoring pattern.

In this way, through the monitoring pattern and the anchor pattern formed in the mask, the operator may effectively shorten a time for inspection of the mask. However, to increase a precision of inspection of the mask, it is preferable that line widths of the monitoring pattern and the anchor pattern are the same.

When etching is performed to make the line widths of the monitoring pattern and the anchor pattern the same, the patterns may be excessively etched. For example, a difference between an etching rate for the line width of the monitoring pattern and an etching rate for the line width of the anchor pattern may occur several times, and in a process of repeatedly etching the monitoring pattern and/or the anchor pattern to reduce the differences, over-etching may be generated in the line width of the monitoring pattern and the line width of the anchor pattern. When an etching process is precisely performed to minimize over-etching, much time is taken in the etching process. Accordingly, a line width correcting process for precisely correcting the line widths of the patterns formed in the mask is additionally performed.

FIG. 1 shows normal distributions of a first line width CDP1 of the monitoring pattern and a second line width CDP2 of the anchor pattern of a mask before, among the mask manufacturing processes, a line width correcting process is performed. Furthermore, the first line width CDP1 and the second line width CDP2 are line widths that are smaller than a target line width. Line widths (critical dimensions) of the monitoring pattern and the anchor pattern have a deviation on purpose before the line width correcting process is performed. Furthermore, the line widths of the two patterns are made to be the same by additionally etching the anchor pattern in the line width correcting process.

When the anchor pattern is etched more than the monitoring pattern in a process of additionally etching the anchor pattern, the line widths of the monitoring pattern and the anchor pattern become different whereby the line widths of the patterns formed in the mask cannot be corrected. Accordingly, when the anchor pattern is additionally etched, the anchor pattern has to be precisely etched.

SUMMARY

Embodiments of the inventive concept provide a substrate treating apparatus that may efficiently treat a substrate, and a substrate treating method.

Embodiments of the inventive concept provide a substrate treating apparatus that may make line widths of pattern formed on a substrate uniform, and a substrate treating method.

Embodiments of the inventive concept provide a substrate treating apparatus that may precisely etch specific pattern formed on a substrate, and a substrate treating method.

The problems that are to be solved by the inventive concept are not limited to the above-mentioned problems, and the unmentioned problems will be clearly understood by those skilled in the art, to which the embodiments of the inventive concept pertain, from the specification and the accompanying drawings.

An embodiment of the inventive concept provides a method for treating a substrate, on which a plurality of reference marks and a pattern are formed. The method includes a process preparing operation, a location information acquiring operation of acquiring information on an actual location of the pattern, and a process executing operation of supplying a treatment liquid to the substrate, and heating the substrate by irradiating laser light to the pattern on the substrate, to which the treatment liquid is applied, the location information acquiring operation includes acquiring information on actual locations of, among the plurality of reference marks, at least three reference marks, and acquiring information of the actual location of the pattern through the information of the actual locations of the reference marks.

An embodiment of the inventive concept provides a method for treating a substrate, on which a plurality of reference marks and a pattern are formed. The method includes a process preparing operation, a liquid treatment operation of supplying a treatment liquid to the substrate, a location information acquiring operation of acquiring information on an actual location of the pattern, and a heating operation of heating the substrate by irradiating laser light to the pattern on the substrate, to which the treatment liquid is applied, the location information acquiring operation includes acquiring information on actual locations of, among the plurality of reference marks, at least three reference marks, and acquiring information of the actual location of the pattern through the information of the actual locations of the reference marks.

The location information acquiring operation may include a first reference mark searching operation of deriving an actual coordinate of a first reference mark formed on the substrate, a second reference mark searching operation of deriving an actual coordinate of a second reference mark formed on the substrate, and a third reference mark searching operation of deriving an actual coordinate of a third reference mark formed on the substrate.

The first reference mark searching operation may include rotating a heating unit that irradiates the laser light by a specific angle, locating the first reference mark on the substrate below an irradiation end of the heating unit by rotating a support unit that supports the substrate, searching for the first reference mark, and deriving a coordinate of an actual location of the first reference mark based on a displacement of the heating unit and a displacement of the support unit.

The second reference mark searching operation may include locating the second reference mark on the substrate below the irradiation end of the heating unit by rotating the support unit, searching for the second reference mark, and deriving a coordinate of an actual location of the second reference mark based on a displacement of the heating unit and a displacement of the support unit.

The third reference mark searching operation may include locating the third reference mark on the substrate below the irradiation end of the heating unit by rotating the support unit, searching for the third reference mark, and deriving a coordinate of an actual location of the third reference mark based on a displacement of the heating unit and a displacement of the support unit.

The process preparing operation may include identifying whether a heating unit that irradiates the laser light to the substrate and a support unit that supports and rotates the substrate are able to be operated.

The process preparing operation may include identifying whether the treatment liquid of a liquid supply unit that supplies the treatment liquid to the substrate is able to be discharged.

The pattern may include a first pattern, and a second pattern that is different from the first pattern, and the laser light may be irradiated to the second pattern.

A deviation between a line width of the first pattern and a line width of the second pattern may be minimized by irradiating the laser light to the second pattern.

The heating unit may include an image module that monitors a point, to which the laser light is irradiated, and the image module may search for the reference mark.

An embodiment of the inventive concept provides a substrate treating apparatus. The substrate treating apparatus includes a support unit that supports and rotates a substrate, a liquid supply unit that supplies a treatment liquid to the substrate supported by the support unit, a heating unit including a laser module that irradiates laser light to a pattern on the substrate, to which the treatment liquid is applied, and an image module that monitors a point, to which the laser light is irradiated, and a controller, a plurality of reference marks are formed on the substrate, the image module acquires actual locations of, among the plurality of reference marks, at least three reference marks, and derives an actual location of the pattern through the actual locations of the reference marks, and the laser module irradiates the laser light to the actual location of the pattern of the substrate.

The image module may derive the actual location of the substrate before the liquid supply unit supplies the treatment liquid to the substrate.

The image module may derive the actual location of the substrate after the liquid supply unit supplies the treatment liquid to the substrate.

The image module may sequentially search for actual coordinates of first to third reference marks formed on the substrate.

The controller may rotate the heating unit by a specific angle such that the heating unit is moved to a search area on the substrate when the actual coordinate of the first reference mark is searched for.

The controller may rotate the support unit, on which the substrate is seated, such that the first reference mark on the substrate is located below an irradiation end of the heating unit when the actual coordinate of the first reference mark is searched for.

The image module may derive an actual location of the first reference mark based on a displacement of the heating unit and a displacement of the support unit after searching for the first reference mark.

The controller may control the heating unit and the support unit to derive an actual location of a second reference mark after deriving the actual location of the first reference mark, the controller may rotate the support unit, on which the substrate is seated, such that the second reference mark on the substrate is located below the irradiation end of the heating unit when the actual coordinate of the second reference mark is searched for, and the image module may derive the actual location of the second reference mark based on a displacement of the heating unit and a displacement of the support unit.

The controller may control the heating unit and the support unit to derive an actual location of a third reference mark after deriving the actual location of the second reference mark, the controller may rotate the support unit, on which the substrate is seated, such that the third reference mark on the substrate is located below the irradiation end of the heating unit when the actual coordinate of the third reference mark is searched for, and the image module may derive the actual location of the third reference mark based on a displacement of the heating unit and a displacement of the support unit.

The pattern may include a monitoring pattern and an anchor pattern, and the heating unit may irradiate the laser light to the anchor pattern.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 4 is a view schematically illustrating an embodiment of a liquid treatment chamber of FIG. 2;

FIG. 5 is a view of the liquid treatment chamber of FIG. 4, when viewed from the top;

FIGS. 14 and 15 are views illustrating an appearance of a substrate treating apparatus that performs a first reference mark searching operation of FIGS. 12 and 13;

FIG. 16 is a view illustrating an appearance of a substrate treating apparatus that performs a second reference mark searching operation of FIGS. 12 and 13;

FIG. 17 is a view illustrating an appearance of a substrate treating apparatus that performs a third reference mark searching operation of FIGS. 12 and 13;

DETAILED DESCRIPTION

Figure 1:
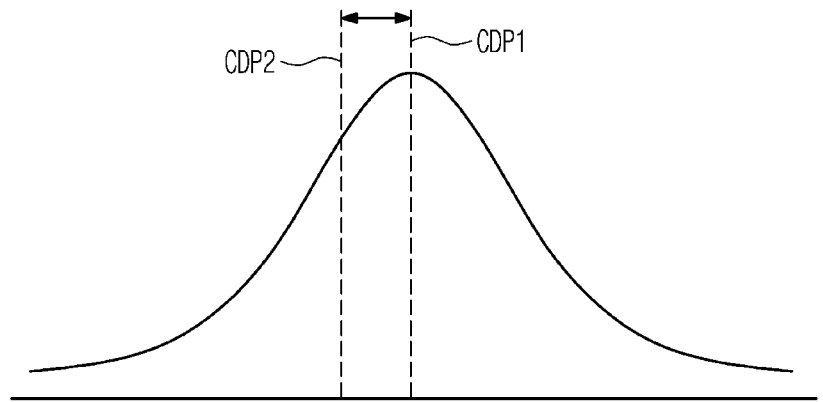
FIG. 1 is a view illustrating a normal distribution of a line width of a monitoring pattern and a line width of an anchor pattern.

Hereinafter, exemplary embodiments of the inventive concept will be described in detail with reference to the accompanying drawings so that those skilled in the art to which the inventive concept pertains may easily carry out the inventive concept. However, the inventive concept may be implemented in various different forms, and is not limited to the embodiments. Furthermore, in a detailed description of the preferred embodiment of the inventive concept, a detailed description of related known functions or configurations will be omitted when they may make the essence of the inventive concept unclear. In addition, the same reference numerals are used for parts that perform similar functions and operations throughout the drawings.

The expression of 'including' some elements may mean that another element may be further included without being excluded unless there is a particularly contradictory description. In detail, the terms "including" and "having" are used to designate that the features, the numbers, the steps, the operations, the elements, the parts, or combination thereof described in the specification are present, and may be understood that one or more other features, numbers, step, operations, elements, parts, or combinations thereof may be added.

The terms of a singular form may include plural forms unless otherwise specified. Furthermore, in the drawings, the shapes and sizes of the components may be exaggerated for clearer description.

The terms such as first and second may be used to describe various components, but the components are not limited to the terms. The terms may be used only for the purpose of distinguishing one component from another component. For example, while not deviating from the scope of the inventive concept, a first component may be named a second component, and similarly, the second component may be named the first component.

When it is mentioned that one component is "connected to" or "coupled to" another component, it should be understood that the first component may be directly connected or coupled to the second component but a third component may be provided therebetweeen. On the other hand, when it is mentioned that a component is "directly connected to" or "directly coupled to" another component, it should be understood that a third component is not present between them. It should be construed that other expressions that describe the relationships between components, such as "between", "directly between", "adjacent to", and "directly adjacent to" may have the same purpose.

In addition, unless defined otherwise, all terms used herein, including technical or scientific terms, have the same meanings as those generally understood by those skilled in the art to which the inventive concept pertains. The terms defined in the generally used dictionaries should be construed as having the meanings that coincide with the meanings of the contexts of the related technologies, and should not be construed as ideal or excessively formal meanings unless clearly defined in the specification of the present disclosure.

Hereinafter, embodiments of the inventive concept will be described with reference to FIGS. 2 to 21.

Figure 2:
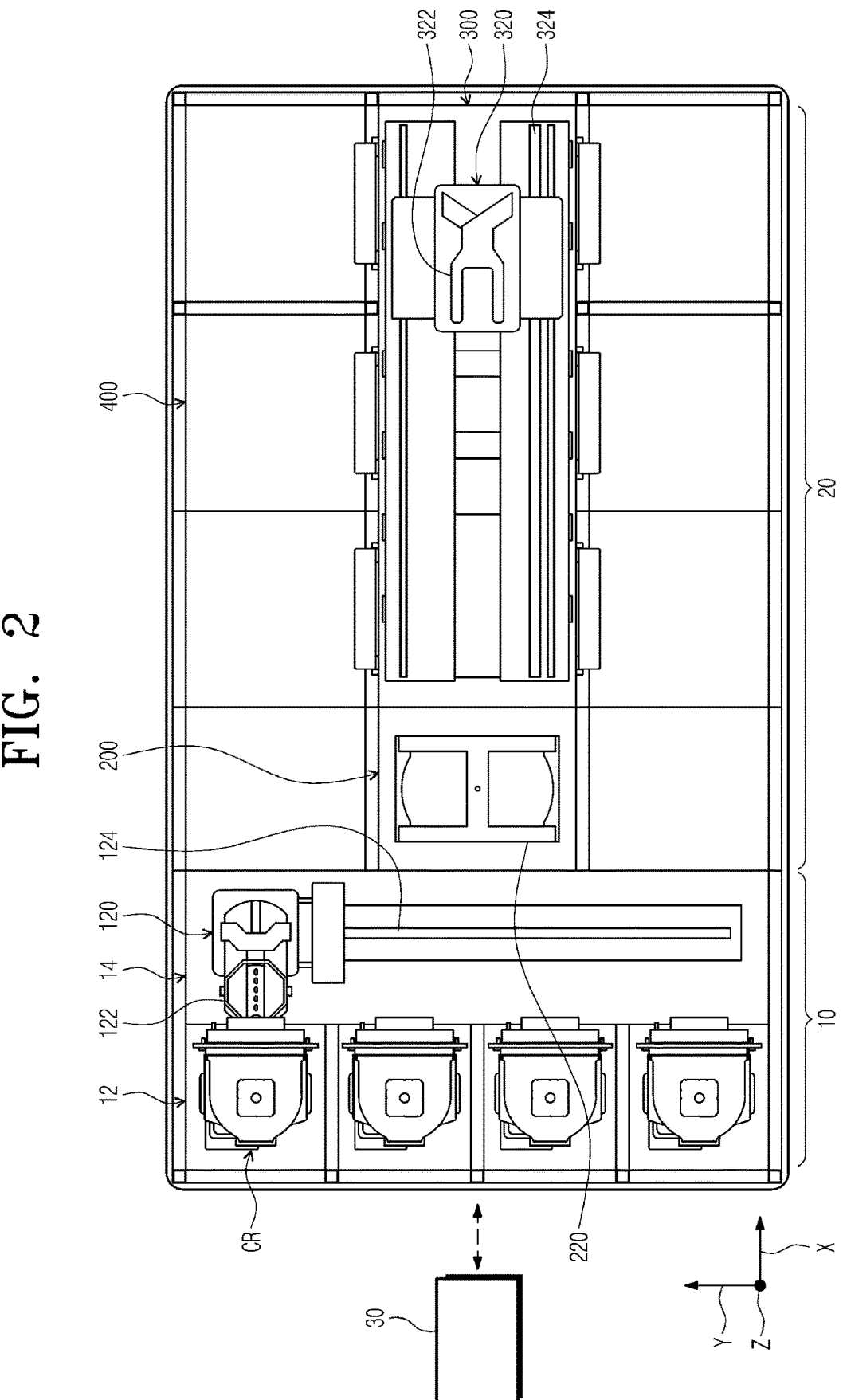
FIG. 2 is a plan view schematically illustrating a substrate treating apparatus according to an embodiment of the inventive concept.

FIG. 2 is a plan view schematically illustrating a substrate treating apparatus according to an embodiment of the inventive concept.

Referring to FIG. 2, a substrate treating apparatus includes an index module 10, a treatment module 20, and a controller 30. When viewed from a top, the index module 10 and the treatment module 20 are disposed along one direction. Hereinafter, a direction, in which the index module 10 and the treatment module 20 are disposed, will be referred to as a first direction "X", a direction that is perpendicular to the first direction "X" when viewed from the top will be referred to as a second direction "Y", and a direction that is perpendicular to both the first direction "X" and the second direction "Y" will be referred to as a third direction "Z".

The index module 10 transfers a substrate "M" from a container CR, in which the substrate "M" is received, to the treatment module 20, and the substrate "M" completely treated by the treatment module 20 is received in the container CR. A lengthwise direction of the index module 10 is the second direction "Y". The index module 10 includes a plurality of load ports 12 and an index frame 14. The load ports 12 are located on an opposite side of the treatment module 20 with respect to the index frame 14. The containers CR, in which the substrates "M" are received, are positioned on the load port 12. The plurality of load ports 12 may be provided, and the plurality of load ports 12 may be disposed along the second direction "Y".

The container CR may be a closed container such as a front open unified pod (FOUP). The container CR may be positioned on the load port 12 by a feeding unit (not illustrated) such as an overhead transfer, an overhead conveyor, or an automatic guided vehicle, or an operator.

An index robot 120 is provided in the index frame 14. A guide rail 124, a lengthwise direction of which is the second direction "Y", may be provided in the index frame 14, and the index robot 120 may be movable on the guide rail 124. The index robot 120 includes a hand 122, on which the substrate "M" is positioned, and the hand 122 may be moved forward and rearward, be rotated about the third direction "Z", and be moved along the third direction "Z". A plurality of hands 122 may be provided to be spaced apart from each other in an upward/downward direction, and the hands 122 may be moved forward and rearward independently.

The controller 30 may control the substrate treating apparatus. The controller 30 may include a process controller including a microprocessor (computer) that executes control of the substrate treating apparatus, a user interface including a keyboard for inputting commands to allow an operator to manage the substrate treating apparatus and a display that visualizes and displays an operation situation of the substrate treating apparatus, and a memory unit for storing a control program for executing processing executed by the substrate treating apparatus under a control of the process controller, or a program for executing processing, that is, a processing recipe in elements according to various data and processing conditions. Furthermore, the user interface and the memory unit may be connected to the process controller. The processing recipe may be stored in a memory medium of the memory unit, and the memory medium may be a hard disk, and may be a transportable disk such as a CD-ROM, a DVD, or the like, a semiconductor memory such as a flash memory.

The controller 30 may control the substrate treating apparatus such that the substrate treating apparatus performs a substrate treating method that will be described below. For example, the controller 30 may control configurations provided to a liquid treatment chamber 400 to perform the substrate treating method that will be described below.

The treatment module 20 includes a buffer unit 200, a transfer chamber 300, and the liquid treatment chamber 400. The buffer unit 200 provides a space, in which the substrate "M" carried into the treatment module 20 and the substrate "M" carried out from the treatment module 20 temporarily stay. The liquid treatment chamber 400 performs a liquid treatment process of liquid-treating the substrate "M" by supplying a liquid onto the substrate "M". The transfer chamber 300 transfers the substrate "M" between the buffer unit 200 and the liquid treatment chamber 400.

The transfer chamber 300 is disposed such that a lengthwise direction thereof is the first direction "X". The buffer unit 200 is disposed between the index module 10 and the transfer chamber 300. The liquid treatment chamber 400 may be disposed on sides of the transfer chamber 300. The liquid treatment chambers 400 and the transfer chamber 300 may be disposed along the second direction "Y". The buffer unit 200 may be located at one end of the transfer chamber 300.

According to an example, the liquid treatment chambers 400 may be disposed on opposite sides of the transfer chamber 300. On one side of the transfer chamber 300, the liquid treatment chambers 400 may be provided on an array of A by B (A and B are integers that are 1 or more than 1) along the first direction "X" and the third direction "Z".

The transfer chamber 300 has a transfer robot 320. A guide rail 324, a lengthwise direction of which is the first direction "X", may be provided in the transfer chamber 300, and the transfer robot 320 may be movable on the guide rail 324. The transfer robot 320 includes a hand 322, on which the substrate "M" is positioned, and the hand 322 may be moved forward and rearward, be rotated about the third direction "Z", and be moved along the third direction "Z". A plurality of hands 332 may be provided to be spaced apart from each other in an upward/downward direction. The plurality of hands 322 may be moved forward and rearward independently.

The buffer unit 200 includes a plurality of buffers 220, on which the substrates "M" are positioned. The buffers 220 are disposed to be spaced apart from each other along the third direction "Z". A front face and a rear face of the buffer unit 200 may be opened. The front face is a surface that faces the index module 10, and the rear face is a surface that faces the transfer chamber 300. The index robot 120 may approach the buffer unit 200 through the front face, and the transfer robot 320 may approach the buffer unit 200 through the rear face.

Hereinafter, the substrate "M" treated in the liquid treatment chamber 400 will be described below.

Figure 3:
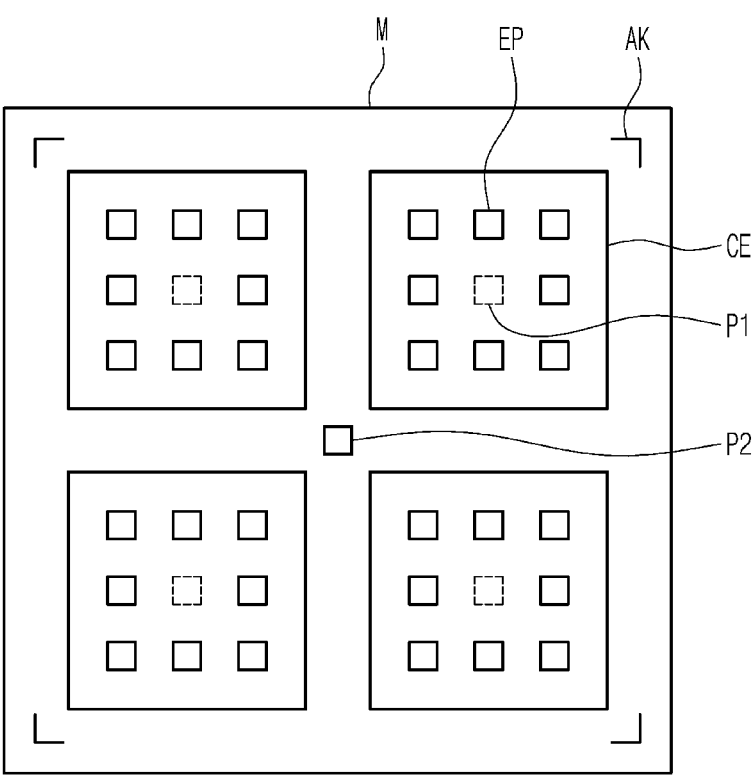
FIG. 3 is a view schematically illustrating an appearance of a substrate treated in a liquid treatment chamber of FIG. 2.

FIG. 3 is a view schematically illustrating an appearance of the substrate treated in the liquid treatment chamber of FIG. 2.

Referring to FIG. 3, an object that is to be treated in the liquid treatment chamber 400 may be a substrate of any one of a wafer, a glass, and a photo mask. For example, the substrate "M" treated in the liquid treatment chamber 400 may be a photo mask that is a frame used in an exposure process.

The substrate "M" may have a rectangular shape. The substrate "M" may be a photo mask that is a frame used during an exposure process. At least one reference mark AK may be marked on the substrate "M". For example, a plurality of reference marks AK may be formed corner areas of the substrate "M". The reference marks AK may be marks called alignment keys used when the substrate "M" is aligned. Furthermore, the reference marks AK may be marks used to derive location information of the substrate "M". For example, an image module 470 that will be described below may acquire an image by photographing the reference marks AK, and may transmit the acquired image to the controller 30. The controller 30 may detect a precise location of the substrate "M" by analyzing the image including the reference marks AK. Furthermore, the reference marks AK also may be used to recognize a location of the substrate "M" when the substrate "M" is transferred.

The plurality of reference marks AK may be formed on the substrate "M". As an example, the plurality of reference marks AK may include first to fourth reference marks AK1, AK2, AK3, and AK4. The first to fourth reference marks AK1, AK2, AK3, and AK4 may be disposed to be spaced apart from each other. The first to fourth reference marks AK1, AK2, AK3, and AK4 may be disposed to be spaced apart from each other at an equal interval.

Cells CE may be formed in the substrate "M". At least one, for example, a plurality of cells CE may be formed. A plurality of patterns may be formed in each of the cells CE. The patterns formed in each of the cells CE may be defined as one pattern group. The patterns formed in the cell CE may include an exposure pattern EP and a first pattern P1. The exposure pattern EP may be used to form an actual pattern on the substrate "M". Furthermore, the first pattern P1 may be a pattern that represents the exposure patterns EP formed in one cell CE. Furthermore, when the plurality of cells CE are provided, a plurality of first patterns P1 may be provided. Furthermore, the plurality of first patterns P1 may be formed in the one cell CE. The first pattern P1 may have a shape, in which some of the exposure patterns EP are combined. The first pattern P1 also may be called a monitoring pattern. Furthermore, the first pattern P1 also may be called a critical dimension monitoring macro.

When an operator inspects the first pattern P1 through a scanning electronic microscope (SEM), qualities of shapes of the exposure patterns EP formed in one cell CE may be estimated. Furthermore, the first pattern P1 may be an inspection pattern. Furthermore, the first pattern P1 may be any one of the exposure patterns EP that participate in an actual exposure process. Furthermore, the first pattern P1 may be not only an inspection pattern but also an exposure pattern that participates in an actual exposure.

A second pattern P2 may be a pattern that represents the exposure patterns EP formed in the entire substrate "M". For example, the second pattern P2 may have a shape, in which some of the first patterns P1 are combined.

When an operator inspects the second pattern P2 through a scanning electronic microscope (SEM), qualities of shapes of the exposure patterns EP formed in one substrate "M" may be estimated. Furthermore, the second pattern P2 may be an inspection pattern. Furthermore, the second pattern P2 may be an inspection pattern that does not participate in an actual exposure process. The second pattern P2 may be called an anchor pattern.

Hereinafter, the substrate treating apparatus provided to the liquid treatment chamber 400 will be described. Furthermore, hereinafter, performance of a fine critical dimension correction process that is a final operation of a process of manufacturing a mask for an exposure process, in a treatment process performed in the liquid treatment chamber 400, will be described as an example.

The substrate "M" carried into the liquid treatment chamber 400 to be treated may be the substrate "M", on which a pre-treatment has been performed. Line widths of the first pattern P1 and the second pattern P2 of the substrate "M" carried into the liquid treatment chamber 400 may be different. For example, a line width of the first pattern P1 may be a first width (for example, 69 nm). A line width of the second pattern P2 may be a second width (for example, 68.5 nm).

Figure 4:
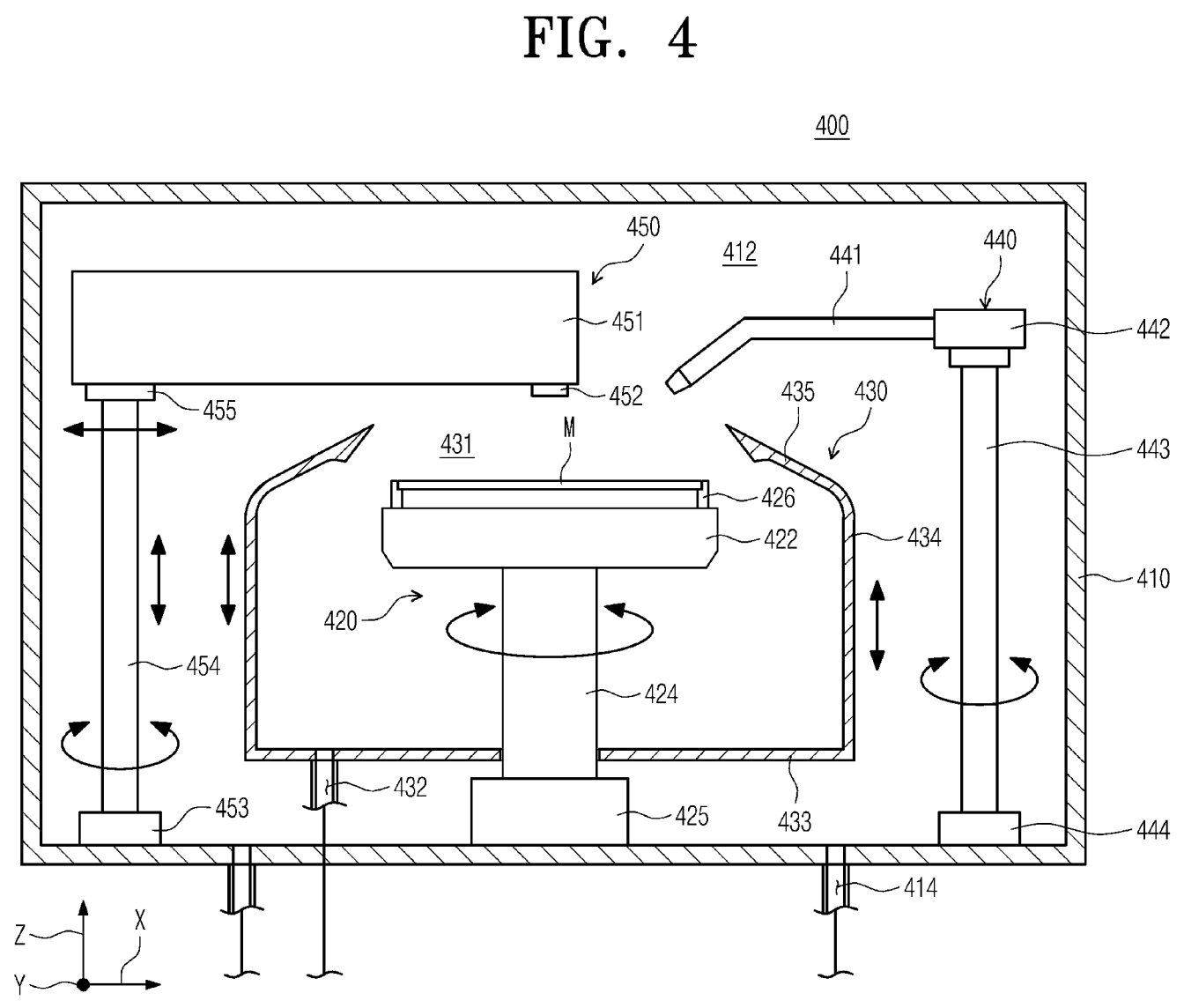
Figure 5:
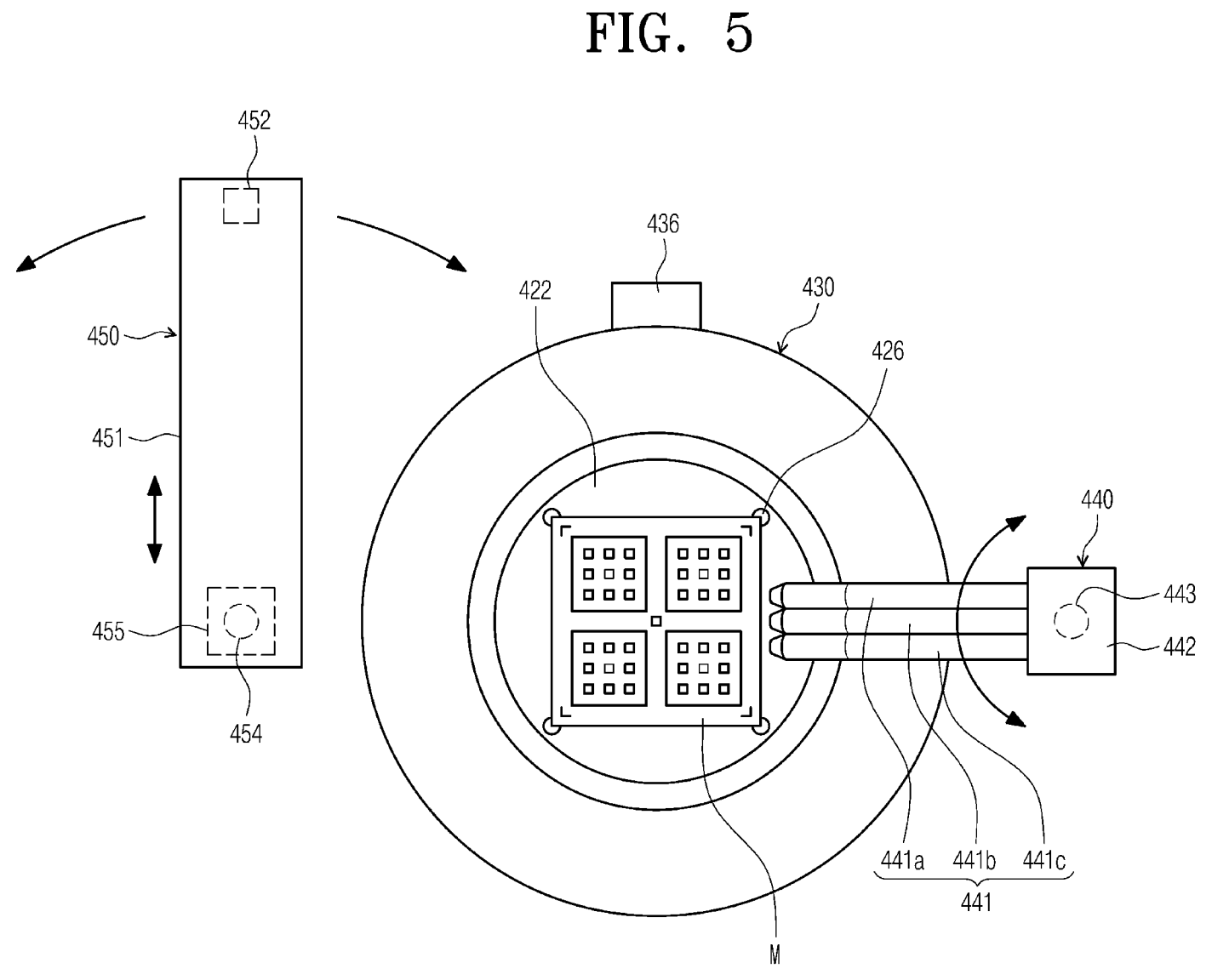

FIG. 4 is a view schematically illustrating an embodiment of the liquid treatment chamber of FIG. 2. FIG. 5 is a view of the liquid treatment chamber of FIG. 4, when viewed from the top. Referring to FIGS. 4 and 5, the liquid treatment chamber 400 may include a housing 410, a support unit 420, a bowl 430, a liquid supply unit 440, a heating unit 450, and an error identifying unit 490.

The housing 410 may have an interior space 412. The housing 410 may have an interior space 412, in which the bowl 430 is provided. The housing 410 may have the interior space 412, in which the liquid supply unit 440 and the heating unit 450 are provided. A carrying in/out hole (not illustrated), through which the substrate "M" may be carried in and out, may be formed in the housing 410. The carrying in/out hole may be selectively opened and closed by a door (not illustrated). Furthermore, a material that is highly resistant to chemicals supplied by the liquid supply unit 440 may be coated on an inner wall surface of the housing 410.

Furthermore, an exhaust hole 414 may be formed on a bottom surface of the housing 410. The exhaust hole 414 may be connected to an exhaust member, such as a pump, which may exhaust the interior space 412. Accordingly, fumes that may be generated in the interior space 412 may be exhausted to an outside through the exhaust hole 414.

The support unit 420 may support the substrate "M" in a treatment space 431 of the bowl 430 that will be described below. The support unit 420 may support the substrate "M". The support unit 420 may rotate the substrate "M".

The support unit 420 may include a chuck 422, a support shaft 424, a driving member 425, and a support pin 426. The support pin 426 may be installed in the chuck 422. The chuck 422 may have a plate shape having a specific thickness. The support shaft 424 may be coupled to a lower side of the chuck 422. The support shaft 424 may be a hollow shaft. Furthermore, the support shaft 424 may be rotated by the driving member 425. For example, the driving member 425 may be a hollow motor. When the driving member 425 rotates the support shaft 424, the chuck 422 coupled to the support shaft 424 may be rotated. The substrate "M" positioned on the support pin 426 installed in the chuck 422 may be rotated together with the chuck 422 when the chuck 422 is rotated.

The support pin 426 may support the substrate "W". The support pin 426 may have a substantially circular shape when viewed from the top. Furthermore, the support pin 426 may have a shape in which a portion corresponding to a corner area of the substrate "M" is recessed downwards when viewed from the top. That is, the support pin 426 may include a first surface that supports a lower side of a corner area of the substrate "M", and a second surface that faces a side of the corner area of the substrate "M" such that movement of the substrate "M" in a lateral direction may be restricted when the substrate "M" is rotated. At least one support pin 426 may be provided. A plurality of support pins 426 may be provided. The number of the support pins 426 may correspond to the number of the corner areas of the substrate "M" having a rectangular shape. The support pins 426 may space a lower surface of the substrate "M" and an upper surface of the chuck 422 apart from each other by supporting the substrate "M".

The bowl 430 may have a vessel shape, an upper side of which is opened. The bowl 430 may have the treatment space 431, and the substrate "M" may be liquid-treated and heated in the treatment space 431. The bowl 430 may prevent the treatment liquid supplied to the substrate "M" from spattering and being delivered to the housing 410, the liquid supply unit 440, and the heating unit 450.

The bowl 430 may include a bottom part 433, a vertical part 434, and an inclined part 435. The bottom part 433 may have an opening, into which the support shaft 424 may be inserted, when viewed from the top. The vertical part 434 may extend from the bottom part 433 along the third direction "Z". The inclined part 435 may extend to be inclined upwards from the vertical part 434. For example, the inclined part 435 may extend to be inclined in a direction that faces the substrate "M" supported by the support unit 420. A discharge hole 432, through which the treatment liquid supplied by the liquid supply unit 440 may be discharged to the outside, may be formed in the bottom part 433. Furthermore, the bowl 430 may be coupled to an elevation member 436 such that a location thereof is changed along the third direction "Z". The elevation member 436 may be a driving device that moves the bowl 430 upwards and downwards. The elevation member 436 may move the bowl 430 upwards while the substrate "M" is liquid-treated and/or heated, and may move the bowl 430 downwards when the substrate "M" is carried into the interior space 412 or the substrate "M" is carried out of the interior space 412.

The liquid supply unit 440 may supply the treatment liquid for liquid-treating the substrate "M". The liquid supply unit 440 may supply the treatment liquid to the substrate "M" supported by the support unit 420. The treatment liquid may include an etching liquid or a rinsing liquid. The etching liquid may be a chemical. The etching liquid may etch the patterns formed on the substrate "M". The etching liquid also may be called etchant. The rinsing liquid may clean the substrate "M". The rinsing liquid may be a known chemical.

The liquid supply unit 440 may include a nozzle 441, a fixed body 442, a rotary shaft 443, and a rotary member 444.

The nozzle 441 may supply the treatment liquid to the substrate "M" supported by the support unit 420. One end of the nozzle 441 may be connected to the fixed body 442, and an opposite end thereof may extend in a direction that faces the substrate "M" from the fixed body 442. The nozzle 441 may extend from the fixed body 442 along the first direction "X". Furthermore, the opposite end of the nozzle 441 may be bent at a specific angle in a direction that faces the substrate "M" supported by the support unit 420 to extend.

The nozzle 441 may include a first nozzle 441a, a second nozzle 441b, and a third nozzle 441c. Any one of the first nozzle 441a, the second nozzle 441b, and the third nozzle 441c may supply, among in the above-described treatment liquids, the chemical "C". Furthermore, another one of the first nozzle 441a, the second nozzle 441b, and the third nozzle 441c may supply, among the above-described treatment liquids, the rinsing liquid "R". Furthermore, still another one of the first nozzle 441a, the second nozzle 441b, and the third nozzle 441c may supply a different kind of chemical "C" from the chemical "C" supplied by the any one of the first nozzle 441a, the second nozzle 441b, and the third nozzle 441c.

The body 442 may fix and support the nozzle 441. The body 442 may be connected to the rotary shaft 443 that is rotated about the third direction "Z" by the rotary member 444. When the rotary member 444 rotates the rotary shaft 443, the body 442 may be rotated about the third direction "Z". Accordingly, a discharge hole of the nozzle 441 may be moved between a liquid supply location that is a location, at which the treatment liquid is supplied to the substrate "M", and a standby location that is a location, at which the treatment liquid is not supplied to the substrate "M".

The heating unit 450 may heat the substrate "M". The heating unit 450 may heat a partial area of the substrate "M". The heating unit 450 may heat the substrate "M", to which the chemical "C" is supplied such that a liquid film is formed. The heating unit 450 may heat the patterns formed on the substrate "M". The heating unit 450 may heat some of the patterns formed on the substrate "M". The heating unit 450 may heat any one of the first pattern P1 and the second pattern P2. For example, the heating unit 450 may heat, among the first pattern P1 and the second pattern P2, the second pattern P2.

The heating unit 450 may include a body 451, a driver 453, a shaft 454, a movement member 455, a laser module 460, the image module 470, and an optical module 480.

The body 451 may be a container having an installation space in an interior thereof. The laser module 460, the image module 470, and the optical module 480, which will be described below, may be installed in the body 451. Furthermore, the body 451 may include an irradiation end 452. The laser light "L" irradiated by the laser module 460 that will be described below may be irradiated to the substrate "M" through the irradiation end 452. Furthermore, the light irradiated by a lighting member 472 that will be described below may be provided through the irradiation end 452. Furthermore, an image of an image acquiring member 471 that will be described below may be captured through the irradiation end 452.

The driver 453 may be a motor. The driver 453 may be connected to the shaft 454. Furthermore, the shaft 454 may be connected to the body 451. The shaft 454 may be connected to the body 451 by a medium of the movement member 455. The driver 453 may be connected to the shaft 454. When the shaft 454 is rotated, the body 451 may be rotated. Accordingly, a location of the irradiation end 452 of the body 451 may be changed. For example, a location of the irradiation end 452 may be changed while the third direction "Z" is taken as a rotation axis thereof. When viewed from the top, a center of the irradiation end 452 may be moved while drawing an arc about the shaft 454. When viewed from the top, the irradiation end 452 may be moved such that a center thereof passes through the center of the substrate supported by the support unit 420. The irradiation end 452 may be moved between a heating location, at which the laser light "L" is irradiated to the substrate "M", and a standby location that is a location, the substrate "M" stands by when the substrate "M" is not heated. Furthermore, the driver 453 may move the shaft 454 in the upward/downward direction. That is, the driver 453 may change the location of the irradiation end 452 in the upward/downward direction. Furthermore, a plurality of drivers 453 may be provided, and any one of them may be provided as a rotation motor that rotates the shaft 454 and another one of them may be provided as a linear motor that moves the shaft 454 in the upward/downward direction.

The movement member 455 may be provided between the shaft 454 and the body 451. The movement member 455 may be an LM guide. The movement member 455 may move the body 451 in a lateral direction. The movement member 455 may move the body 451 in the first direction "X" and/or the second direction "Y". A location of the irradiation end 452 of the heating unit 450 may be variously changed by the movement member 455 and the driver 453.

Figure 6:
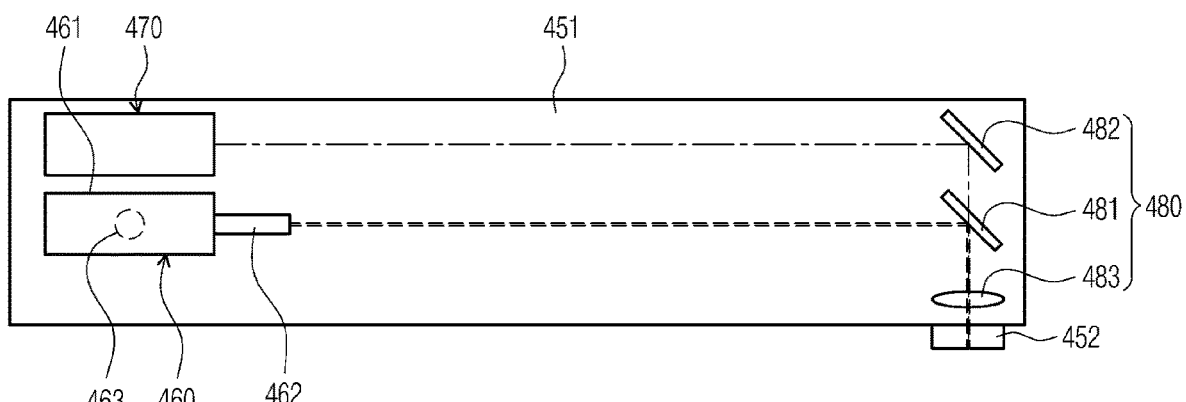
FIG. 6 is a view illustrating appearances of a body of a heating unit of FIG. 4, a laser module, an image module, and an optical module.
Figure 7:
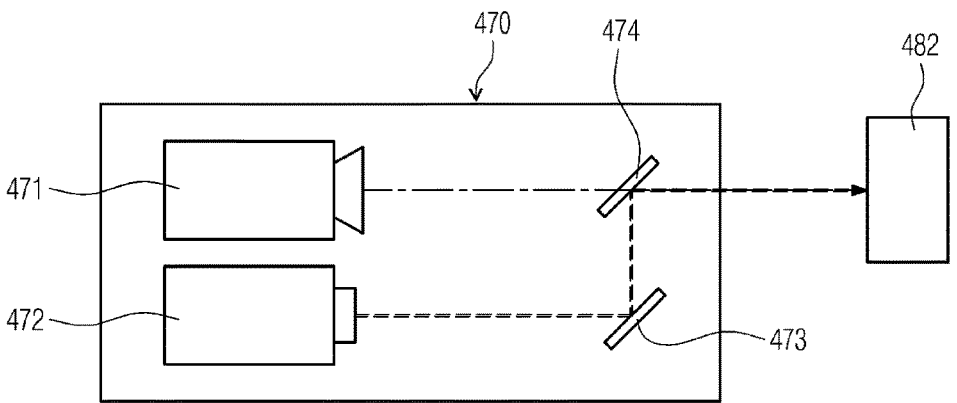
FIG. 7 is a view an image module of FIG. 6, when viewed from a top.

FIG. 6 is a view illustrating appearances of the body of the heating unit of FIG. 4, the laser module, the image module, and the optical module. FIG. 7 is a view the image module of FIG. 6, when viewed from a top.

Referring to FIGS. 6 and 7, a laser irradiating part 461, a beam expander 462, and a tilting member 463 may be installed in the body 451. Furthermore, the image module 470 may be installed in the body 451. Furthermore, the optical module 480 may be installed in the body 451.

The laser module 460 may include the laser irradiating part 461, the beam expander 462, and the tilting member 463. The laser irradiating part 461 may irradiate the laser light "L". The laser irradiating part 461 may irradiate the laser light "L" having straightness. A shape/profile of the laser light "L" irradiated by the laser irradiating part 461 may be adjusted by the beam expander 462. For example, a diameter of the laser light "L" irradiated by the laser irradiating part 461 may be changed by the beam expander 462. For example, a diameter of the laser light "L" irradiated by the laser irradiating part 461 may be increased or decreased by the beam expander 462.

The tilting member 463 may tilt an irradiation direction of the laser light "L" irradiated by the laser irradiating part 461. For example, the tilting member 463 may tilt the irradiation direction of the laser light "L" irradiated by the laser irradiating part 461 by rotating the laser irradiating part 461 about one axis. The tilting member 463 may include a motor.

The image module 470 may monitor the laser light "L" irradiated by the laser irradiating part 461. The image module 470 may include the image acquiring member 471, the lighting member 472, a first reflection plate 473, and a second reflection plate 474. The image acquiring member 471 may acquire an image for the substrate "M" and/or a coordinate system 491 of the error identifying unit 490, which will be described below. The image acquiring member 471 may be a camera. The image acquiring member 471 may be a vision device. The image acquiring member 471 may acquire an image including a point, to which the laser light "L" irradiated by the laser irradiating part 461 is irradiated.

The lighting member 472 may provide light such that the image may be easily acquired by the image acquiring member 471. The light provided by the lighting member 472 may be reflected sequentially along the first reflection plate 473 and the second reflection plate 474.

The optical module 480 may be configured such that an irradiation direction of the laser light "L" irradiated by the laser irradiating part 461, a photographing direction, in which the image acquiring member 471 acquires the image, and an irradiation direction of the light provided by the lighting member 472 may be on the same axis when viewed from the top. The lighting member 472 may deliver the light to an area, in which the laser light "L" is irradiated by the optical module 480. Furthermore, the image acquiring member 471 may acquire an image, such as an image/picture for an area, to which the laser light "L" is irradiated, in real time. The optical module 480 may include a first reflection member 481, a second reflection member 482, and a lens 483.

The first reflection member 481 may change the irradiation direction of the laser light "L" irradiated by the laser irradiating part 461. For example, the first reflection member 481 may change the irradiation direction of the laser light "L" irradiated horizontally to a downward direction. Furthermore, the laser light "L" refracted by the first reflection member 481 may sequentially pass through the lens 483 and the irradiation end 452 and may be delivered to the substrate "M" that is to be treated or the coordinate system 491 that will be described below.

The second reflection member 482 may change the photographing direction of the image acquiring member 471. For example, the second reflection member 482 may change the photographing direction of the image acquiring member 471, which is a horizontal direction, to a vertically downward direction. Furthermore, the second reflection member 482 may change the irradiation direction of the light of the lighting member 472, which is delivered sequentially via the first reflection plate 473 and the second reflection plate 474 from the horizontal direction to a vertically downward direction.

Furthermore, the first reflection member 481 and the second reflection member 482 may be provided at the same location when viewed from the top. Furthermore, the second reflection member 482 may be disposed on an upper side of the first reflection member 481. Furthermore, the first reflection member 481 and the second reflection member 482 may be tilted at the same angle.

Figure 8:
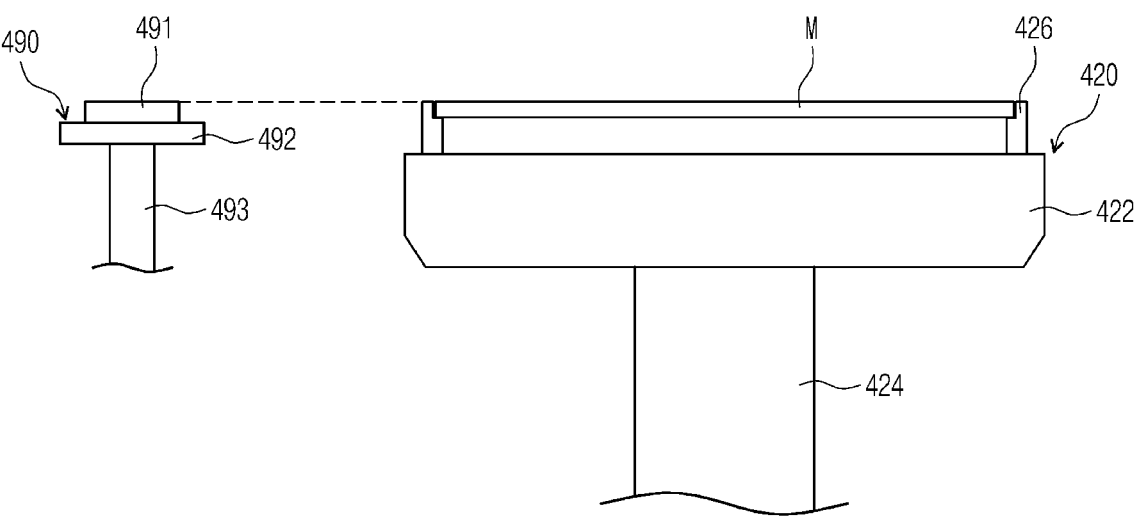
FIG. 8 is a view illustrating an error identifying unit of a liquid treatment chamber of FIG. 4, and a support unit.
Figure 9:
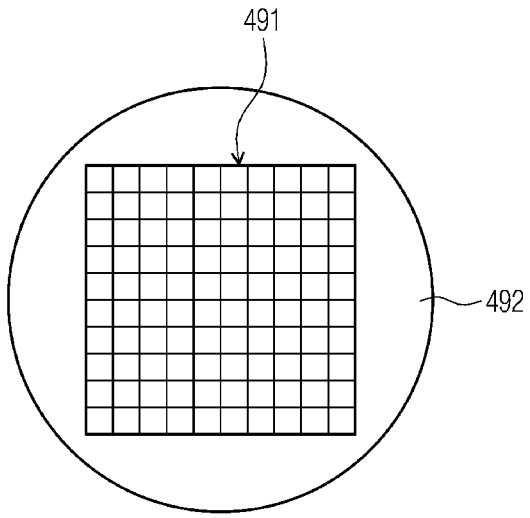
FIG. 9 is a view of the error identifying unit of FIG. 8, when viewed from the top.

FIG. 8 is a view illustrating the error identifying unit of the liquid treatment chamber of FIG. 4, and the support unit. FIG. 9 is a view of the error identifying unit of FIG. 8, when viewed from the top.

Referring to FIGS. 8 and 9, the error identifying unit 490 may identify whether an error is generated between an irradiation location of the laser light "L" and a preset target location TP. For example, the error identifying unit 490 may be provided in the interior space 412. Furthermore, the error identifying unit 490 may be installed in an area on a lower side of the irradiation end 452 when the irradiation end 452 is located at the above-described standby location. The error identifying unit 490 may include the coordinate system 491, a plate 492, and a support frame 493.

The coordinate system 491 also may be called a global coordinate. A preset target location TP may be marked on the coordinate system 491. Furthermore, the coordinate system 491 may include scales to identify an error between the target location TP and the irradiation location, at which the laser "L" is irradiated. Furthermore, the coordinate system 491 may be installed on the plate 492. The plate 492 may be supported by the support frame 493. A height of the coordinate system 491, which is determined by the plate 492 and the support frame 493, may be the same as that of the substrate "M" supported by the support unit 420. For example, a height from a bottom surface of the housing 410 to an upper surface of the coordinate system 491 may be the same as a height from the bottom surface of the housing 410 to an upper surface of the substrate "M" supported by the support unit 420. This is for causing the height of the irradiation end 452 when an error is identified by using the error identifying unit 490 and the height of the irradiation end 452 when the substrate "M" is heated to coincide with each other. When the irradiation direction of the laser light "L" irradiated by the laser irradiating part 461 is distorted with respect to the third direction "Z" even by a small degree, the irradiation location of the laser light "L" may be changed according to the height of the irradiation end 452, and thus, the coordinate system 491 may be provided at the same height as that of the substrate "M" supported by the support unit 420.

Hereinafter, a method for treating a substrate according to an embodiment of the inventive concept will be described in detail. The method for treating the substrate, which will be described below, may be performed by the above-described liquid treatment chamber 400. Furthermore, the above-described controller 30 may control configurations of the liquid treatment chamber 400 such that the method for treating the substrate, which will be described blow, is performed by the liquid treatment chamber 400. For example, the controller 30 may generate a control signal that controls at least any one of the support unit 420, the elevation member 436, the liquid supply unit 440, and the heating unit 450 such that the configurations of the liquid treatment chamber 400 performs the substrate treating method that will be described below.

Figure 10:
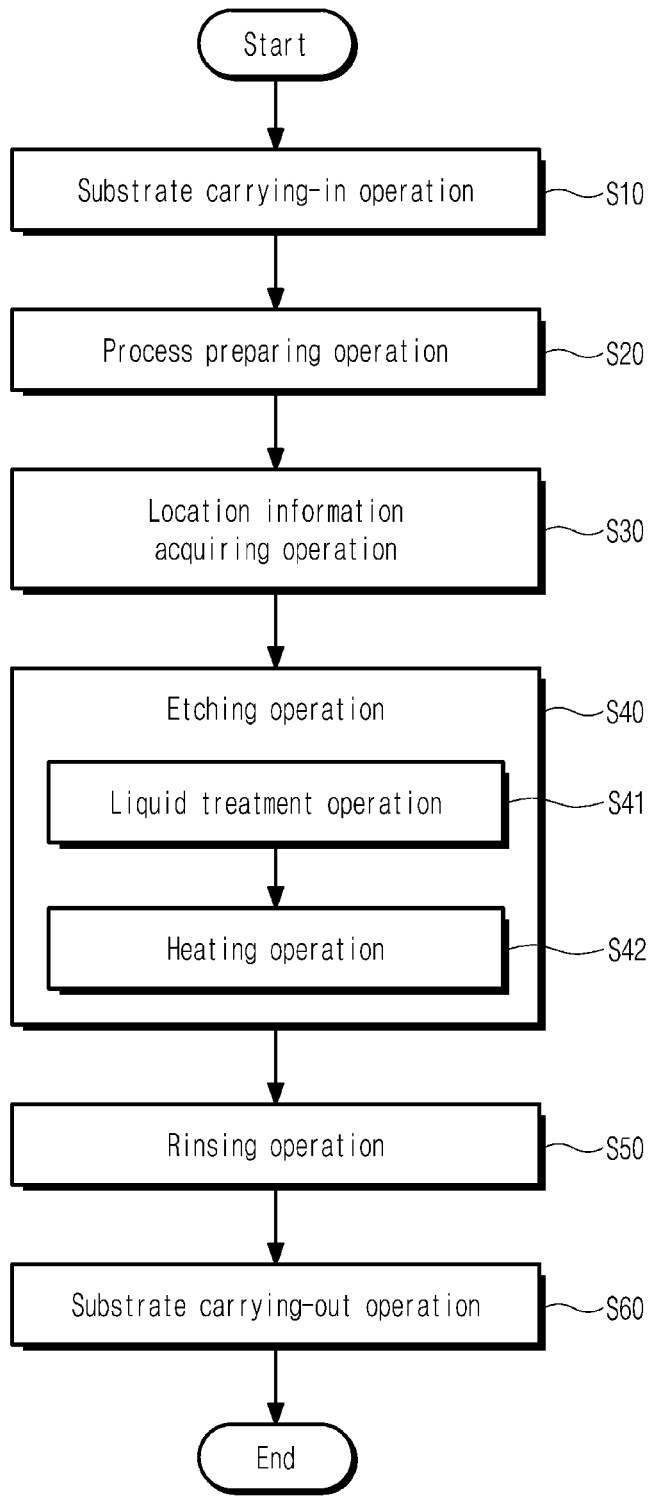
FIG. 10 is a flowchart illustrating a substrate treating method according to an embodiment of the inventive concept.

FIG. 10 is a flowchart illustrating a substrate treating method according to an embodiment of the inventive concept;

Referring to FIG. 10, the substrate treating method according to an embodiment of the inventive concept may include a substrate carrying-in operation S10, a process preparing operation S20, a location information acquiring operation S30, an etching operation S40, a rinsing operation S50, and a substrate carrying-out operation S60.

In the substrate carrying-in operation S10, a door may open a carrying-in/out hole formed in the housing 410. Furthermore, in the substrate carrying-in operation S10, the transfer robot 320 may seat the substrate "M" on the support unit 420. While the transfer robot 320 seats the substrate "M" on the support unit 420, the elevation member 436 may lower a location of the bowl 430. The process preparing operation S20 may be performed after the substrate "M" has been carried in.

Figure 11:
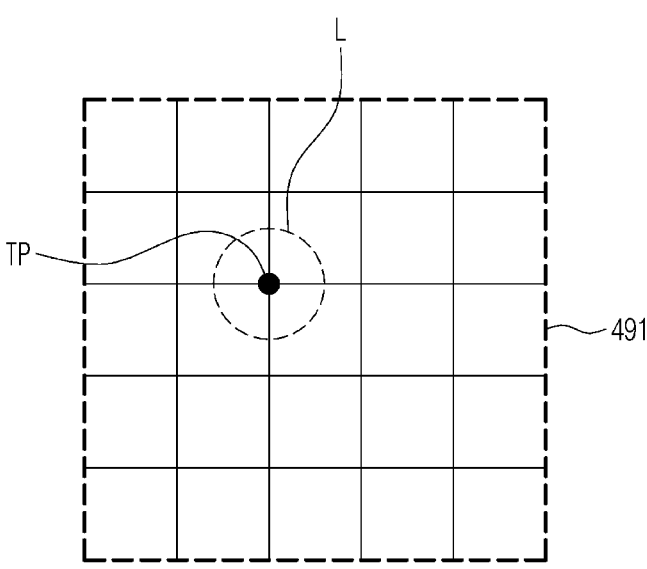
FIG. 11 is a view illustrating an appearance of identifying an error between an irradiation location of laser light and a preset target location, by a substrate treating apparatus in a process preparing operation of FIG. 10.

In the process preparing operation S20, it may be identified whether there is an error in the irradiation location of the laser light "L" irradiated to the substrate "M". For example, in the process preparing operation S20, the laser module 460 may irradiate laser light "L" for a test to the coordinate system 491 of the error identifying unit 490. When the laser light "L" for a test, which is irradiated by the laser module 460, as illustrated in FIG. 11, coincide with the preset target location TP marked in the coordinate system 491, it may be determined that the laser irradiating part 461 is not distorted and thus the following location information acquiring operation S30 may be performed. Furthermore, in the process preparing operation S20, not only it may be identified whether there occurs an error in the irradiation location of the laser light "L" but also the configurations of the liquid treatment chamber 400 may return to an initial state.

In the process preparing operation S20, it may be identified whether the heating unit 450 may be operated. When the heating unit 450 is located at the standby location, the coordinate system 491 may be located below the irradiation end 452 of the heating unit 450. In the process preparing operation S20, it may be identified whether the laser module 460 of the heating unit 450 may be identified by irradiating the laser light "L" to the coordinate system 491 in a state, in which the heating unit 450 is located at the standby location. Furthermore, it may be identified whether the image module 470 of the heating unit 450 may be operated, through an image captured by photographing an appearance of the laser light "L" irradiated to the coordinate system 491. Furthermore, it may be identified whether the laser module 460 and the image module 470, through the image of the image module 470.

In the process preparing operation S20, it may be identified whether the support unit 420 may be operated. The controller 30 may identify whether the support unit 420 is operated, by rotating the support unit 420, on which the substrate "M" is seated, in the process preparing operation S20. The controller 30 may identify whether the support unit 420 is operated, by rotating the support unit 420 in the one direction and/or an opposite direction to the one direction of the support unit 420.

In the process preparing operation S20, it may be identified whether the liquid supply unit 440 may discharge the treatment liquid. The controller 30 may locate the liquid supply unit 440 at the standby location. The controller 30 may identify whether the treatment liquid is discharged from the nozzle 441 of the liquid supply unit 440 located at the standby location. The controller 30 may identify whether the liquid supply unit 440 may discharge the treatment liquid, by discharging the treatment liquid from the first to third nozzles 441a, 441b, and 441c.

In the location information acquiring operation S30, the location of the substrate "M" may be identified. In the location information acquiring operation S30, the location information of the patterns formed in the substrate "M" may be acquired. That is, in the location information acquiring operation S30, information on the location of the substrate "M", to which the chemical "C" and the rinsing liquid "R" are to be supplied, and the locations of the patterns, to which the laser light "L" is to be irradiated, may be acquired. The location information acquired in the location information acquiring operation S30 may be information on a coordinate of the center of the substrate "M" and coordinates of the patterns.

Figure 12:
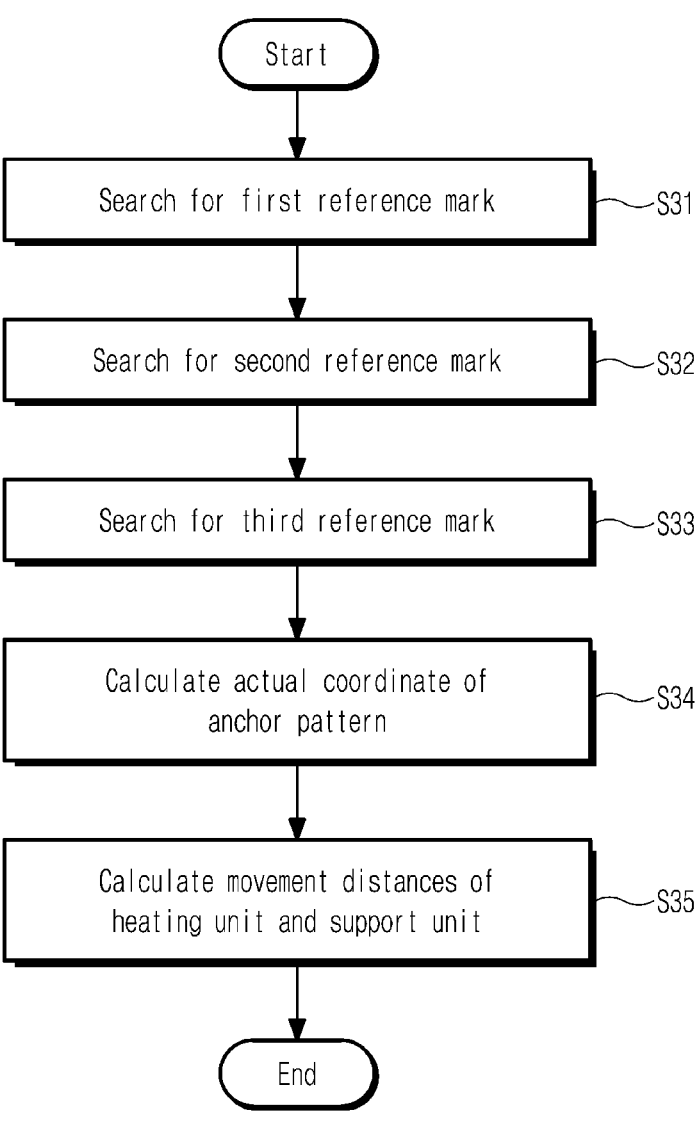
FIG. 12 is a flowchart illustrating a location information acquiring operation of FIG. 10.
Figure 13:
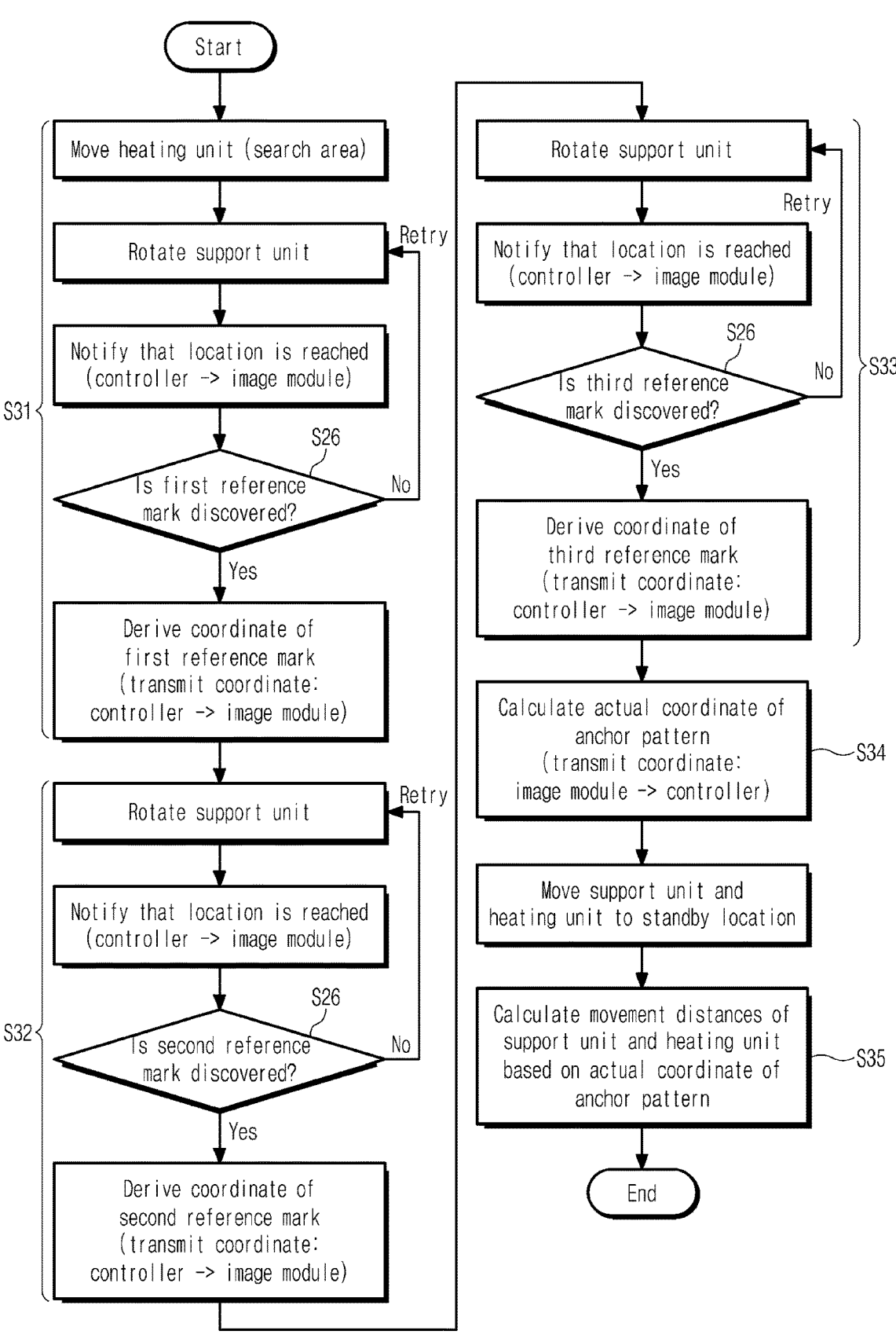
FIG. 13 is a flowchart of the location information acquiring operation of FIG. 12.
Figure 14:
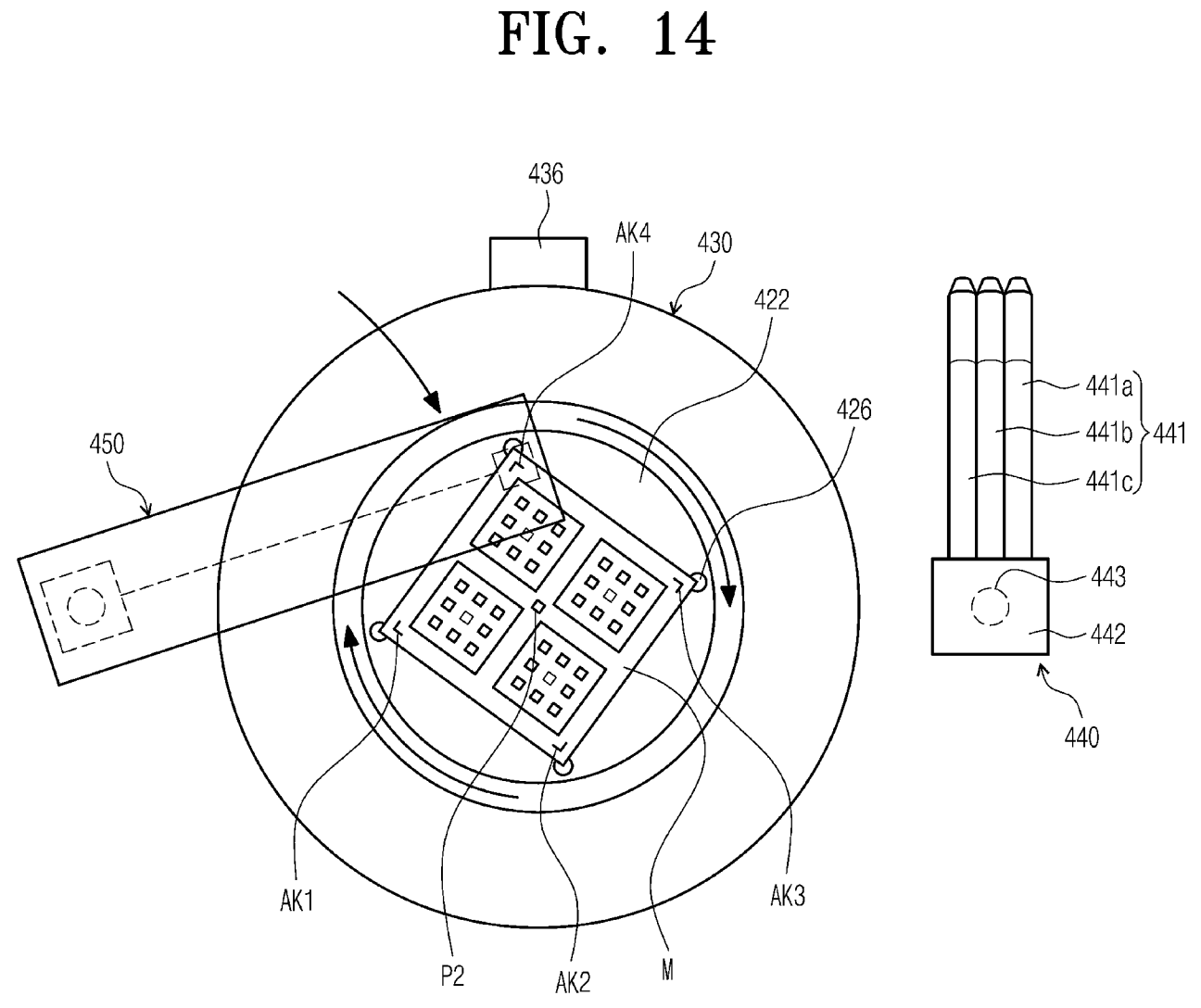
Figure 15:
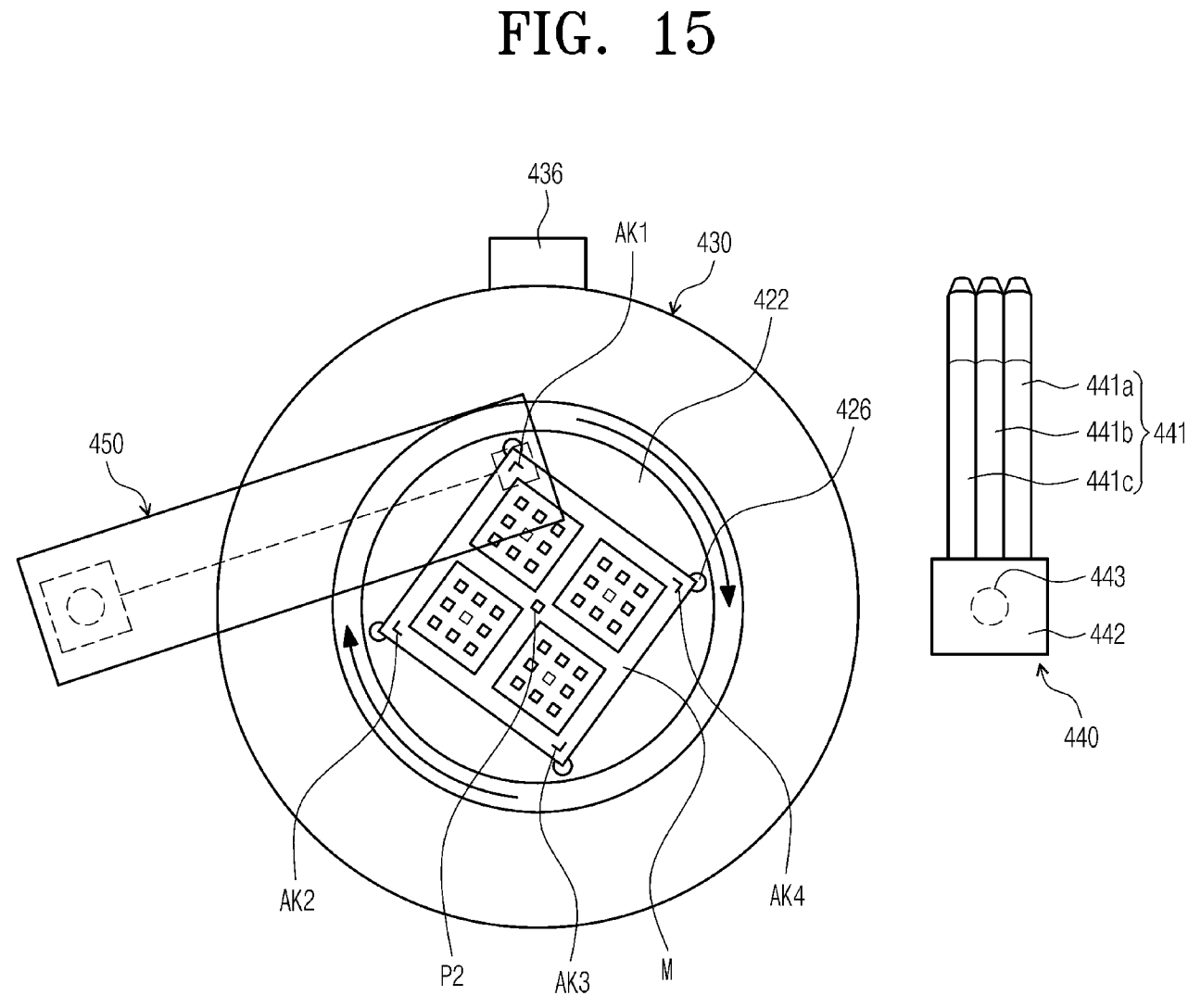
Figure 16:
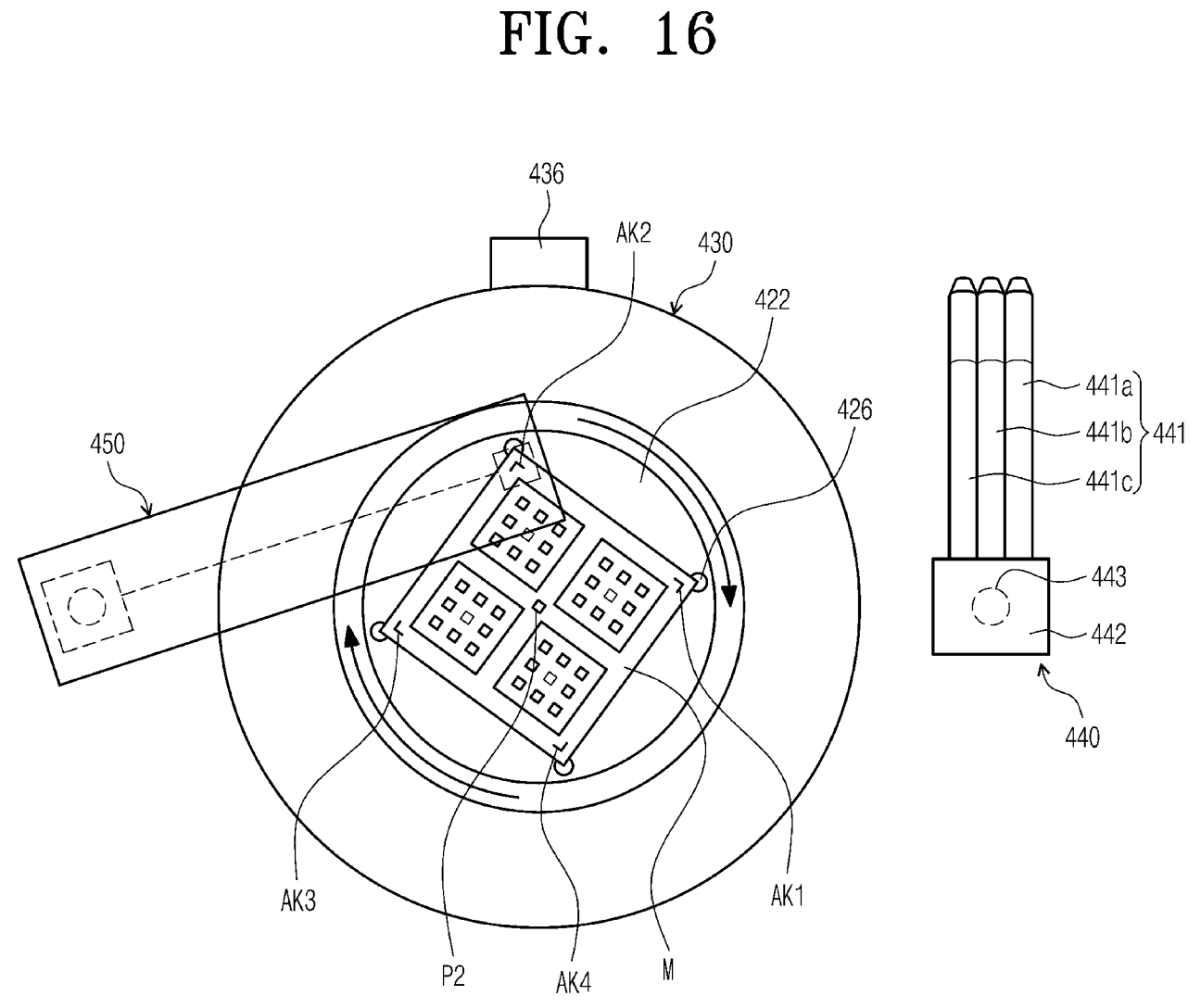
Figure 17:
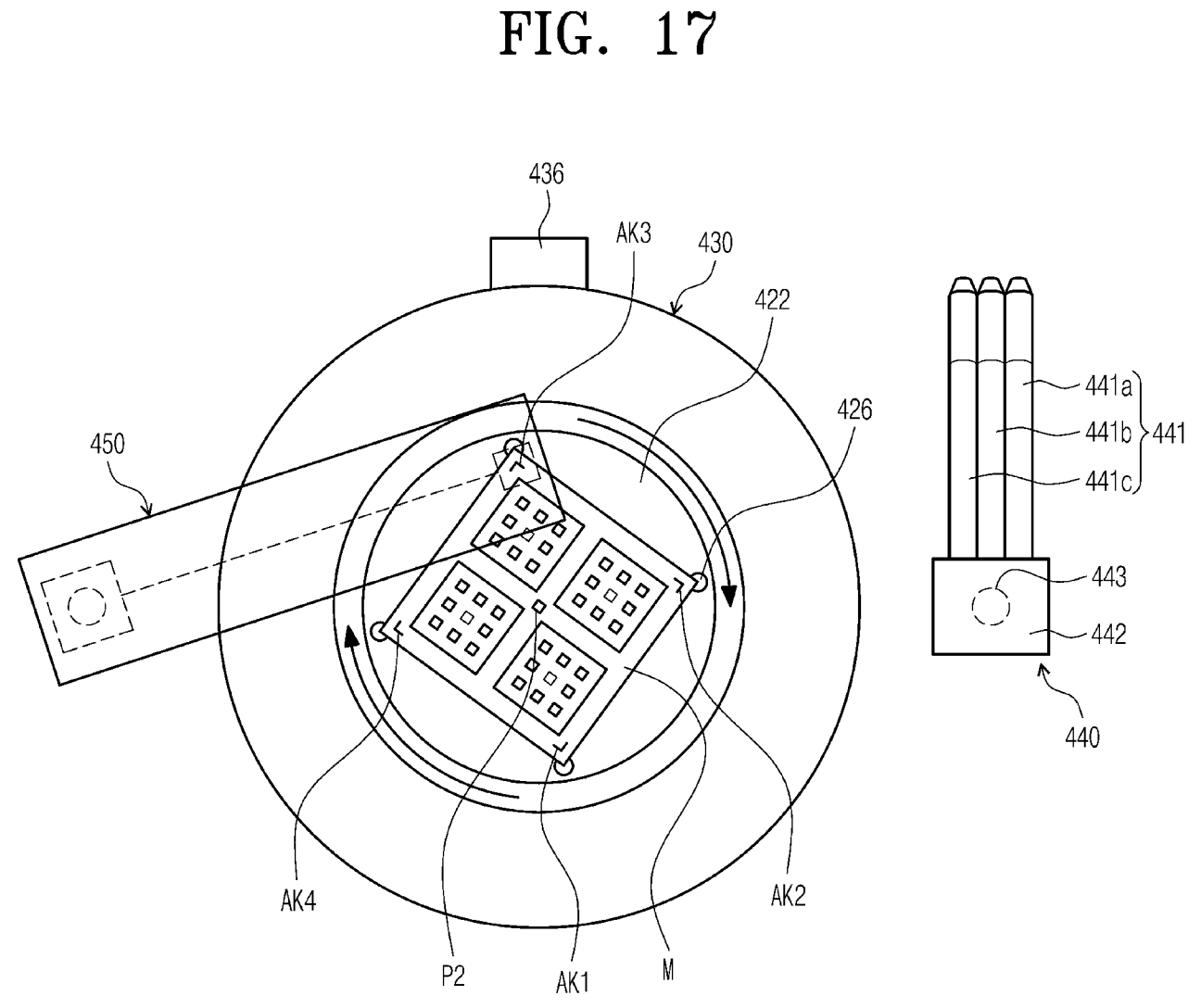

FIG. 12 is a flowchart illustrating the location information acquiring operation of FIG. 10. FIG. 13 is a flowchart of the location information acquiring operation of FIG. 12. FIGS. 14 and 15 are views illustrating an appearance of the substrate treating apparatus that performs the first reference mark searching operation of FIGS. 12 and 13. FIG. 16 is a view illustrating an appearance of the substrate treating apparatus that performs the second reference mark searching operation of FIGS. 12 and 13. FIG. 17 is a view illustrating an appearance of the substrate treating apparatus that performs the third reference mark searching operation of FIGS. 12 and 13.

In the location information acquiring operation S30, the irradiation end 452 of the heating unit 450 may be moved between the standby location and the heating location, and the support unit 420 may rotate the substrate "M" in one direction. In the location information acquiring operation S30, information on the actual locations of, among the plurality of reference marks AK, at least three reference marks, may be acquired, and information of the patterns, to which the laser light "L" is to be irradiated, may be acquired through the information of the actual locations of the reference marks AK. Then, the location information may be coordinate information.

In the location information acquiring operation S30, the actual locations of the first to third reference marks AK1, AK2, and AK3 formed on the substrate "M" may be sequentially derived. The location information acquiring operation S30 may include a first reference mark searching operation of deriving an actual coordinate of the first reference mark AK1, a second reference mark searching operation of deriving an actual coordinate of the second reference mark AK2 formed on the substrate "M", and a third reference mark searching operation of deriving an actual coordinate of the third reference mark AK3 formed on the substrate "M". The first reference mark searching operation, the second reference mark searching operation, the third reference mark searching operation may be sequentially performed.

Referring to FIGS. 13 and 14, in the first reference mark searching operation, the heating unit 450 that irradiates the laser light "L" may be rotated at a specific angle. The heating unit 450 may be rotated about the shaft 454. When the heating unit 450 is rotated, the irradiation end 452 of the heating unit 450 may be moved to the search area on the substrate "M". A rotation angle of the heating unit 450 may be a preset angle. When the heating unit 450 is rotated at a preset angle, the irradiation end 452 of the heating unit 450 may be located in the search area. The search area may be a corner area of the substrate "M". The search area may be a corner area on the substrate "M", on which the reference marks AK are formed. The search area may be an area, in which, among a plurality of apexes of the substrate "M" seated on the support unit 420, the closest apex is included.

In the first reference mark searching operation, the first reference mark AK1 on the substrate "M" may be located below the irradiation end 452 of the heating unit 450 by rotating the support unit 420 that supports the substrate "M"

after the heating unit 450 is rotated. The substrate "M" may be rotated one direction or an opposite direction thereto. When the substrate "M" is rotated by the support unit 420, as illustrated in FIG. 14, the first reference mark AK1 may be located below the irradiation end 452 at a specific time point.

When the first reference mark AK1 is located below the irradiation end 452, the image module 470 may search for the first reference mark AK1. Searching for the first reference mark AK1 by the image module 470 may mean that the first reference mark AK1 is located at a center of a photographing screen of the image module 470. Searching for the first reference mark AK1 by the image module 470 may mean that the first reference mark AK1 is located such that the center of a photographing screen of the image module 470 and the center of the first reference mark AK1 coincide with each other. In a process of searching for the first reference mark AK1 by the image module 470, the heating unit 450 and the support unit 420 may be gradually moved.

When the image module 470 fails to discover the first reference mark AK1, the first reference mark AK1 may be searched for again after the support unit 420 is rotated. The image module 470 may repeatedly rotate the support unit 420 and search for the first reference mark AK1 until the first reference mark AK1 is found.

When the first reference mark AK1 is found, the image module 470 may acquire an image for the first reference mark AK1. Through the image acquired by the image module 470, the controller 30 may acquire the coordinate value of the actual locations of the first reference mark AK. The coordinate value of the actual location or the first reference mark AK1 may be calculated by calculating a displacement of the heating unit 450 and a displacement of the support unit 420.

When the first reference mark searching operation is completed, a second reference mark searching operation is performed. Referring to FIG. 15, in the second reference mark searching operation, the second reference mark AK2 on the substrate "M" may be located below the irradiation end 452 of the heating unit 450 by rotating the support unit 420. The substrate "M" may be rotated one direction or an opposite direction thereto. When the substrate "M" is rotated by the support unit 420, as illustrated in FIG. 15, the second reference mark AK2 may be located below the irradiation end 452 at a specific time point.

When the second reference mark AK2 is located below the irradiation end 452, the image module 470 may search for the second reference mark AK2. Searching for the second reference mark AK2 by the image module 470 may mean that the second reference mark AK2 is located at a center of a photographing screen of the image module 470. Searching for the second reference mark AK2 by the image module 470 may mean that the second reference mark AK2 is located such that the center of a photographing screen of the image module 470 and the center of the second reference mark AK2 coincide with each other. In a process of searching for the second reference mark AK2 by the image module 470, the heating unit 450 and the support unit 420 may be gradually moved.

When the image module 470 fails to find the second reference mark AK2, the second reference mark AK2 may be searched for again after the support unit 420 is rotated. The image module 470 may repeatedly rotate the support unit 420 and search for the second reference mark AK2 until the second reference mark AK2 is found.

When the second reference mark AK2 is found, the image module 470 may acquire an image for the second reference mark AK2. Through the image acquired by the image module 470, the controller 30 may acquire the coordinate value of the actual locations of the second reference mark AK2. The coordinate value of the actual location or the second reference mark AK2 may be calculated by calculating a displacement of the heating unit 450 and a displacement of the support unit 420.

When the second reference mark searching operation is completed, a third reference mark searching operation is performed. Referring to FIG. 16, in the third reference mark searching operation, the third reference mark AK3 on the substrate "M" may be located below the irradiation end 452 of the heating unit 450 by rotating the support unit 420. The substrate "M" may be rotated one direction or an opposite direction thereto. When the substrate "M" is rotated by the support unit 420, as illustrated in FIG. 17, the third reference mark AK3 may be located below the irradiation end 452 at a specific time point.

When the third reference mark AK3 is located below the irradiation end 452, the image module 470 may search for the third reference mark AK3. Searching for the third reference mark AK3 by the image module 470 may mean that the third reference mark AK3 is located at a center of a photographing screen of the image module 470. Searching for the third reference mark AK3 by the image module 470 may mean that the third reference mark AK3 is located such that the center of a photographing screen of the image module 470 and the center of the third reference mark AK3 coincide with each other. In a process of searching for the third reference mark AK3 by the image module 470, the heating unit 450 and the support unit 420 may be gradually moved.

When the image module 470 fails to find the third reference mark AK3, the third reference mark AK3 may be searched for again after the support unit 420 is rotated. The image module 470 may repeatedly rotate the support unit 420 and search for the third reference mark AK3 until the third reference mark AK3 is found.

When the third reference mark AK3 is found, the image module 470 may acquire an image for the third reference mark AK3. Through the image acquired by the image module 470, the controller 30 may acquire the coordinate value of the actual location of the third reference mark AK3. The coordinate value of the actual location or the third reference mark AK3 may be calculated by calculating a displacement of the heating unit 450 and a displacement of the support unit 420.

The image module 470 may calculate a coordinate of an actual location of a pattern, to which the laser light "L" is to be irradiated, through the information on the coordinates of the actual locations of the first to third reference marks AK1, AK2, and AK3. The image module 470 may calculate an actual coordinate of the first pattern P1 or the second pattern P2. The image module 470 may calculate the actual coordinate of, among the first pattern P1 and the second pattern P2, the second pattern P2.

After calculating the actual coordinate of the pattern, to which the laser light "L" is to be irradiated, the displacements of the support unit 420 and the heating unit 450 may be calculated based on the actual coordinate of the pattern, to which the laser light "L" is to be irradiated. The image module 470 may calculate a rotation degree or a rotation amount of the support unit 420 based on the actual coordinate of the pattern, to which the laser light "L" is to be irradiated. Furthermore, the image module 470 may calculate a rotation degree, a rotation amount, or a displacement of the heating unit 450 based on the actual coordinate of the pattern, to which the laser light "L" is to be irradiated.

After the actual coordinate of the pattern, to which the laser light "L" is to be irradiated, and the displacements of the heating unit 450 and the support unit 420 are calculated by the image module 470, the etching operation 40 of FIG. 10 is performed.

Meanwhile, a leftward/rightward width of the substrate "M" and coordinate data on a center point of the substrate "M", and coordinate data on locations of the first pattern P1, the second pattern P2, and the exposure pattern EP in the substrate "M" may be memorized in the controller 30 in advance. The controller 30 may acquire information on the center point of the substrate "M", and the locations of the first pattern P1 and the second pattern P2, based on the acquired coordinate value for the reference mark AK and the above-described data memorized in advance.

Figure 18:
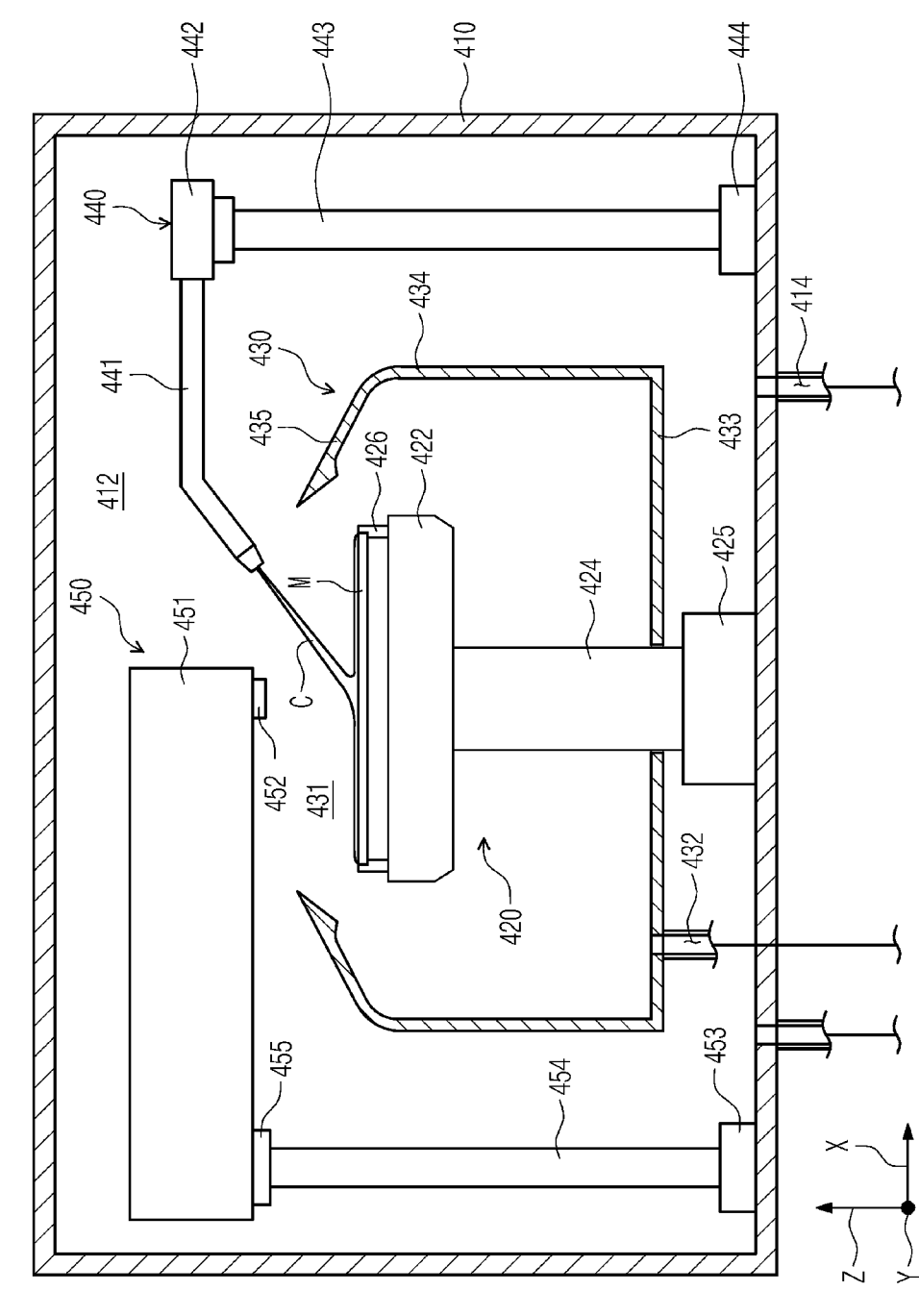
FIG. 18 is a view illustrating an appearance of a substrate treating apparatus that performs a liquid treatment operation of FIG. 10.
Figure 19:
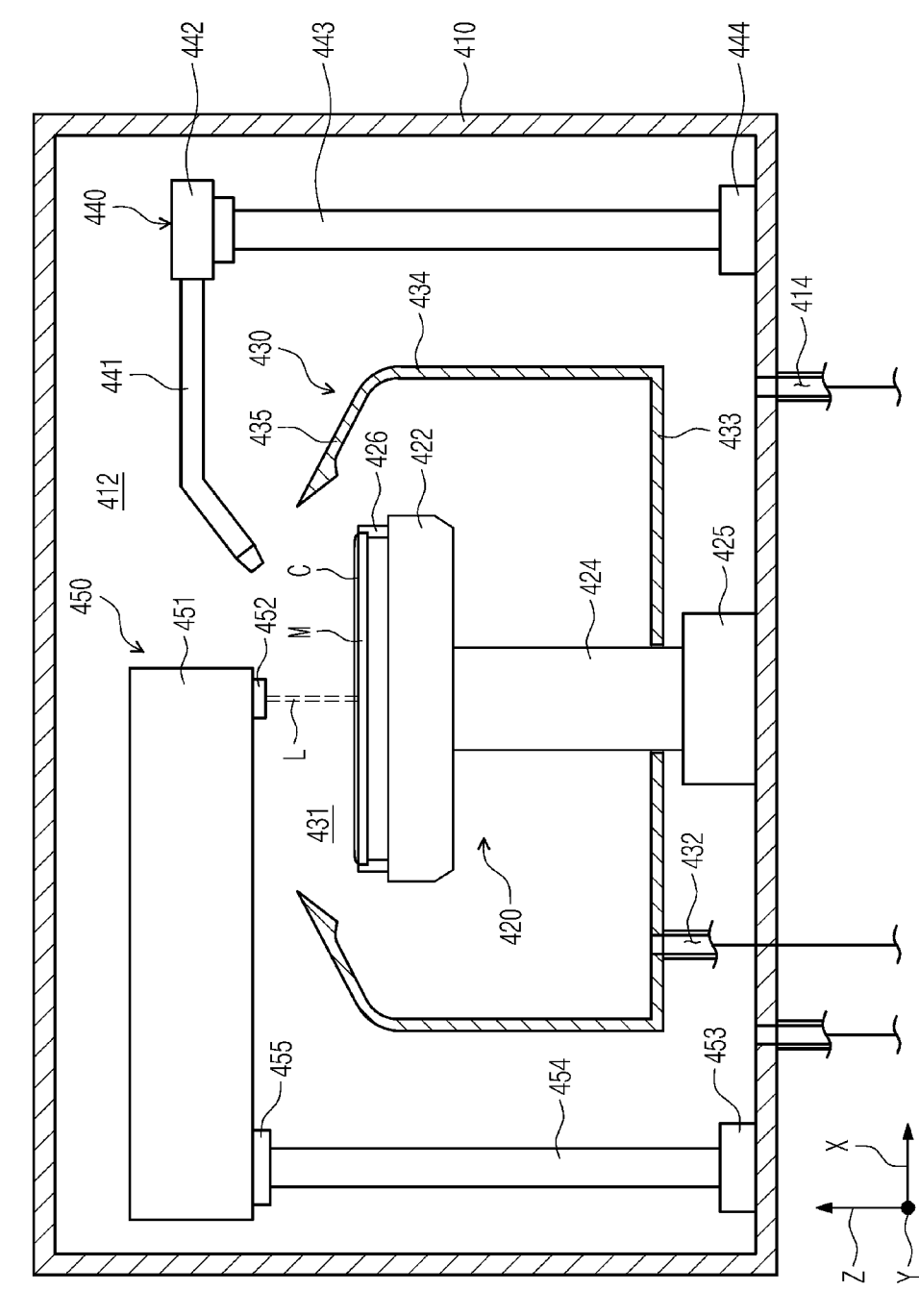
FIG. 19 is a view illustrating an appearance of a substrate treating apparatus that performs a heating operation of FIG. 10.

FIG. 18 is a view illustrating an appearance of the substrate treating apparatus that performs the liquid treatment operation of FIG. 10. FIG. 19 is a view illustrating an appearance of the substrate treating apparatus that performs the heating operation of FIG. 10.

In the etching operation S40, the pattern formed on the substrate "M" may be etched. In the etching operation S40 may etch the pattern formed on the substrate "M" such that the line width of the first pattern P1 and the line width of the second pattern P2 coincide with each other. The etching operation S40 may be a line width correcting process of correcting the above-described difference between the line widths of the first pattern P1 and the second pattern P2. The etching operation S40 may include a liquid treatment operation S41 and a heating operation S42.

The liquid treatment operation S41 may be an operation of supplying the chemical "C" that is etchant to the substrate "M" by the liquid supply unit 440 as illustrated in FIG. 17. In the liquid treatment operation S41, the support unit 420 may not rotate the substrate "M". In the following heating operation S42, distortion of the location of the substrate "M" has to be minimized to precisely irradiate the laser light "L" in a specific pattern, and this is because the location of the substrate "M" is distorted when the substrate "M" is rotated. Furthermore, an amount of the chemical "C" supplied in the liquid treatment operation 41 may be large enough such that the chemical "C" supplied onto the substrate "M" forms a puddle. For example, the amount of the chemical "C" supplied in the liquid treatment operation S41 may be large enough such that the chemical "C" covers the entire upper surface of the substrate "M" but does not flow over from the substrate "M" or the amount of the chemical "C" is not too large even though the chemical "C" flows over. According to necessities, an etching liquid may be supplied to the entire upper surface of the substrate "M" while the location of the nozzle 441 is changed.

In the heating operation S42, the substrate "M" may be heated by irradiating the laser light "L" to the substrate "M". In the heating operation S42, as illustrated in FIG. 18, the heating module 460 may heat the substrate "M" by irradiating the laser light "L" to the substrate "M", in which a liquid film is formed as the chemical "C" is supplied. In the heating operation S42, the laser light "L" may be irradiated to a specific area of the substrate "M". A temperature of the specific area, to which the laser light "L" is irradiated, may be increased. Accordingly, an etching degree by the chemical "C" in the area, to which the laser light "L" is irradiated, may be increased. Furthermore, in the heating operation S42, the laser light "L" may be irradiated to any one of the first pattern P1 and the second pattern P2. For example, the laser light "L" may be irradiated to, among the first pattern P1 and the second pattern P2, only the second pattern P2. Accordingly, an etching performance for the second pattern P2 of the chemical "C" is enhanced. Accordingly, the line width of the first pattern P1 may be changed to a target line width (for example, 70 nm) at the first width (for example, 69 nm). Furthermore, the line width of the second pattern P2 may be changed to the target line width (for example, 70 nm) at the second width (for example, 68.5 nm). That is, a deviation of the line width of the pattern formed on the substrate "M" may be minimized by enhancing an etching performance for a partial area of the substrate "M".

Figure 20:
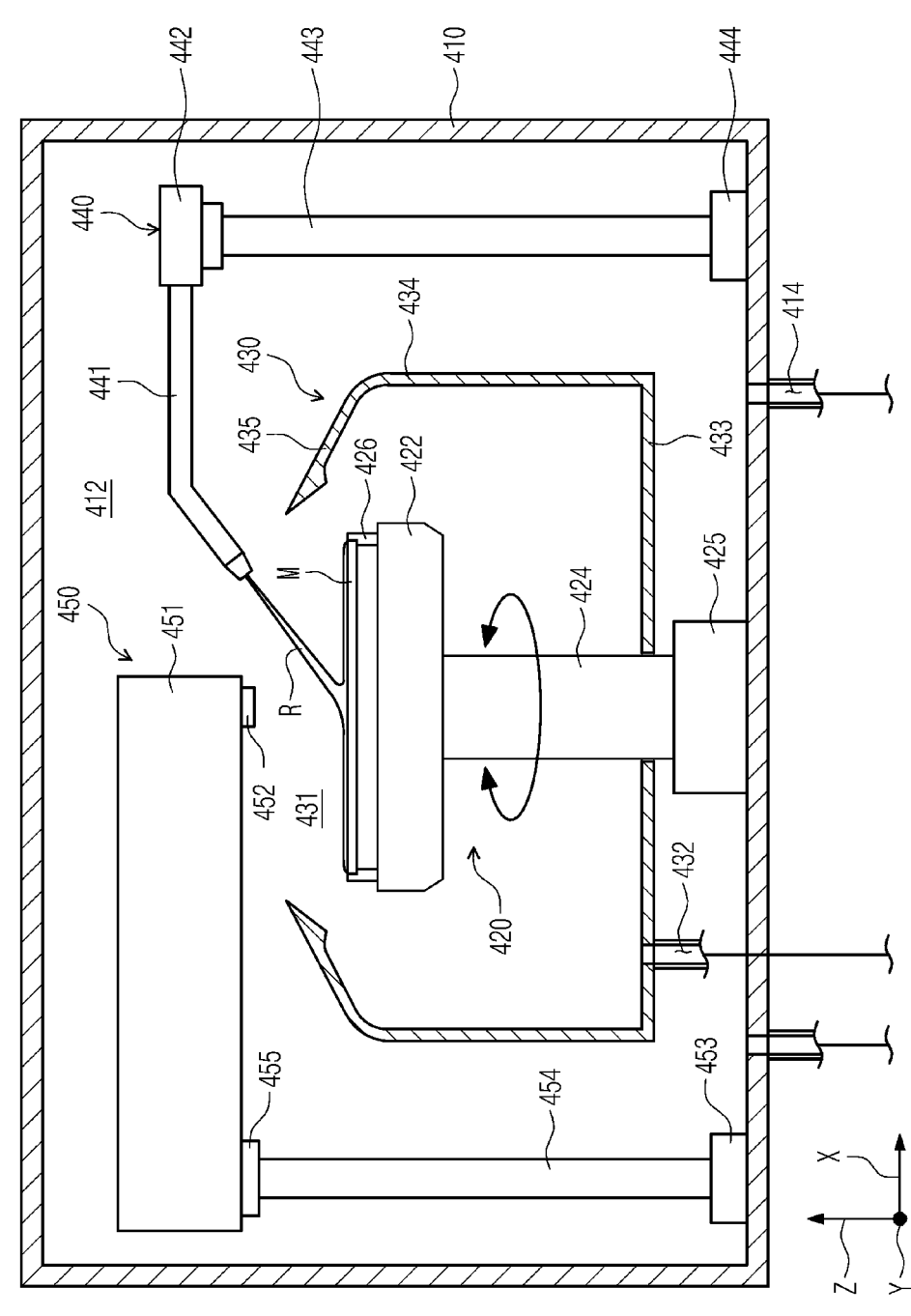
FIG. 20 is a view illustrating an appearance of a substrate treating apparatus that performs a rinsing operation of FIG. 10.

FIG. 20 is a view illustrating an appearance of the substrate treating apparatus that performs the rinsing operation of FIG. 10.

In the rinsing operation S50, process by-products generated in the etching operation S40 may be removed from the substrate "M". In the rinsing operation S50, as illustrated in FIG. 19, the process by-products formed on the substrate "M" may be removed by supplying a rinsing liquid "R" to the rotating substrate "M". According to the necessities, to dry the rinsing liquid "R" that resides on the substrate "M", the support unit 420 may remove the rinsing liquid "R" that resides on the substrate "M" by rotating the substrate "M" at a high speed.

In the substrate carrying-out operation S60, the substrate "M" that has been treated may be carried out from the interior space 412. In the substrate carrying-out operation S60, the door may open a carrying-in/out hole formed in the housing 410. Furthermore, in the substrate carrying-out operation S60, the transfer robot 320 may unload the substrate "M" from the support unit 420, and may carry the unloaded substrate "M" out of the interior space 412.

Figure 21:
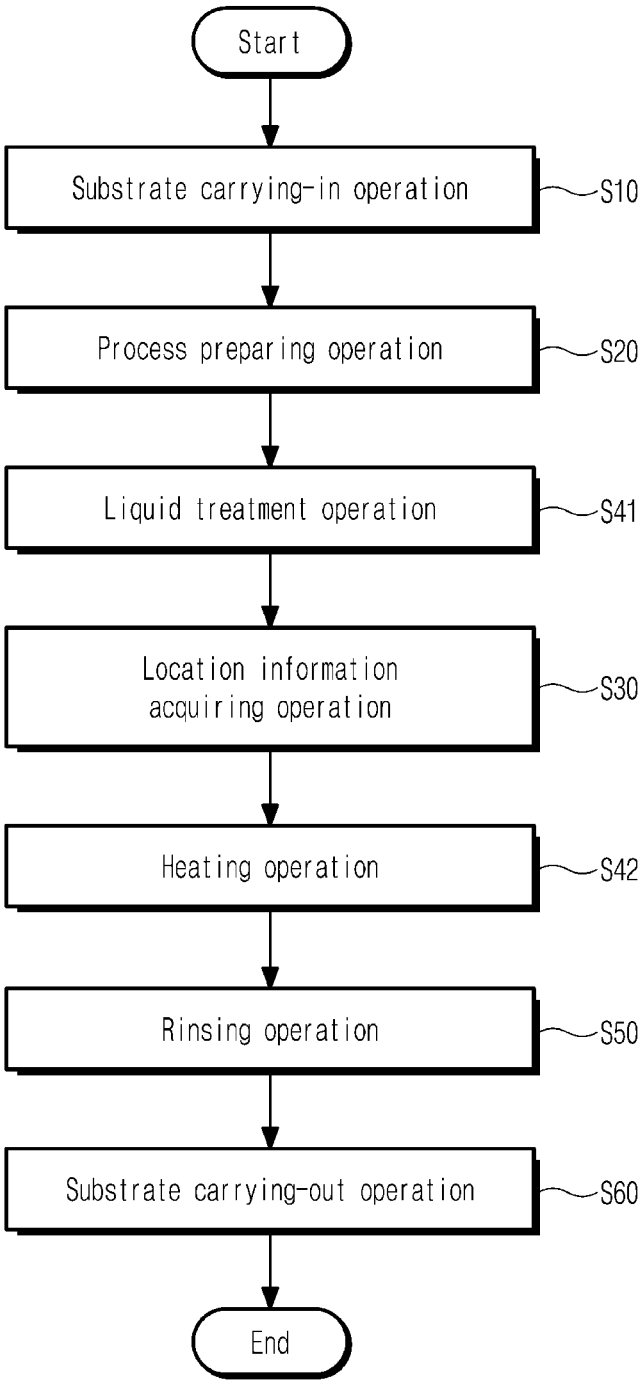
FIG. 21 is a flowchart illustrating the substrate treating method according to another embodiment of the inventive concept.

FIG. 21 is a flowchart illustrating the substrate treating method according to another embodiment of the inventive concept.

FIG. 10 is a flowchart illustrating the substrate treating method according to an embodiment of the inventive concept. FIG. 20 is a flowchart illustrating the substrate treating method according to another embodiment of the inventive concept.

The substrate treating method according to the embodiment of the inventive concept and the substrate treating method according to another embodiment are different only in the sequence of the location information acquiring operation S30, and the contents of the operations are the same. In detail, the location information acquiring operation S30 according to the embodiment and the location information acquiring operation S30 according to another embodiment are the same and are different only in the sequence.

According to the substrate treating method according to the embodiment, the location information acquiring operation S30 may be performed before the treatment liquid is supplied to the substrate "M", and according to the substrate treating method according to another embodiment, the location information acquiring operation S30 may be performed between the liquid treatment operation of supplying the treatment liquid to the substrate "M" and the heating operation of irradiating the laser light to the substrate "M". That is, in the substrate treating method according to another embodiment, the location information acquiring operation S30 may be performed in a state, in which the treatment liquid has been supplied to the substrate "M".

To irradiate the laser light "L" to the target location on the substrate "M", it is necessary to accurately locate the irradiation end 452 of the heating unit 450 at the target location.

However, the substrate "M" may not be positioned at a proper location on the support unit 420 by the transfer robot 320.

However, according to the embodiment of the inventive concept, the actual coordinates of the first to third reference marks AK1, AK2, and AK3 may be derived, and the actual locations of the patterns, to which the laser light is to be irradiated, may be derived by using the actual coordinates of the first to third reference marks AK1, AK2, and AK3.

According to an embodiment of the inventive concept, a substrate treating apparatus that may efficiently treat a substrate, and a substrate treating method may be provided.

According to an embodiment of the inventive concept, line widths of pattern formed on a substrate may be made uniform.

According to an embodiment of the inventive concept, a specific pattern formed on a substrate may be precisely etched.

The effects of the inventive concept are not limited to the above-mentioned effects, and the unmentioned effects can be clearly understood by those skilled in the art to which the inventive concept pertains from the specification and the accompanying drawings.

The above detailed description exemplifies the inventive concept. Furthermore, the above-mentioned contents describe the exemplary embodiment of the inventive concept, and the inventive concept may be used in various other combinations, changes, and environments. That is, the present disclosure can be modified and corrected without departing from the scope of the present disclosure that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating apparatus comprising:
   a support unit comprising a support chuck and a support pin including an upper and a lower surface, the support unit configured to support and rotate a substrate;
   a liquid supply unit including a nozzle, the nozzle configured to supply a treatment liquid to the substrate supported by the support unit;
   a heating unit including a laser configured to irradiate laser light to a pattern on the substrate, to which the treatment liquid is applied;
   a camera module comprising an image sensor, a lighting source, and optical elements configured to monitor a point to which the laser light is irradiated;
   an error-identifying unit including a coordinate plate positioned at substantially the same height as an upper surface of the substrate supported by the support pin and having a target mark, the error-identifying unit being configured to verify a targeting accuracy of the laser light prior to substrate processing; and
   a controller configured to coordinate operation of the camera module and the laser,
   wherein a plurality of reference marks are formed on the substrate,
   wherein the camera module acquires actual locations of, among the plurality of reference marks, at least three reference marks of the plurality of reference marks, and derives an actual location of the pattern through the actual locations of the reference marks, and
   wherein the laser irradiates the laser light to the actual location of the pattern on the substrate, and
   wherein the substrate has a rectangular shape, and
   wherein the plurality of reference marks are formed at respective different corner areas of the substrate.

2. The substrate treating apparatus of claim 1, wherein the camera module derives the actual location of the substrate before the nozzle supplies the treatment liquid to the substrate.

3. The substrate treating apparatus of claim 1, wherein the camera module derives the actual location of the substrate after the nozzle supplies the treatment liquid to the substrate.

4. The substrate treating apparatus of claim 1, wherein the camera sequentially searches for actual coordinates of first to third reference marks formed on the substrate.

5. The substrate treating apparatus of claim 4, wherein the controller is configured to rotate the heating unit by a specific angle such that the heating unit is moved to a search area on the substrate when the actual coordinate of the first reference mark is searched for.

6. The substrate treating apparatus of claim 5, wherein the controller is configured to rotate the support unit, on which the substrate is seated, such that the first reference mark on the substrate is located below an irradiation end of the heating unit when the actual coordinate of the first reference mark is found.

7. The substrate treating apparatus of claim 6, wherein the camera module derives an actual location of the first reference mark based on a displacement of the heating unit and a displacement of the support unit after searching for the first reference mark.

8. The substrate treating apparatus of claim 7, wherein the controller is configured to derive an actual location of a second reference mark after deriving the actual location of the first reference mark, and
   rotate the support chuck, on which the substrate is seated, such that the second reference mark on the substrate is located below the irradiation end of the heating unit when the actual coordinate of the second reference mark is searched for, and
   wherein the camera module derives the actual location of the second reference mark based on a displacement of the heating unit and a displacement of the support chuck.

9. The substrate treating apparatus of claim 8, wherein the controller is configured to derive an actual location of a third reference mark after deriving the actual location of the second reference mark, and
   rotate the support chuck, on which the substrate is seated, such that the third reference mark on the substrate is located below the irradiation end of the heating unit when the actual coordinate of the third reference mark is searched for, and
   wherein the camera module derives the actual location of the third reference mark based on a displacement of the heating unit and a displacement of the support chuck.

10. The substrate treating apparatus of claim 1, wherein the pattern includes a monitoring pattern and an anchor pattern, and
   wherein the heating unit irradiates the laser light to the anchor pattern.

11. The substrate treating apparatus of claim 10, wherein the anchor pattern is selectively irradiated based on a deviation between the line width of the anchor pattern and that of the monitoring pattern.

12. The substrate treating apparatus of claim 10, wherein the heating unit irradiates the laser light to the anchor pattern while the substrate remains stationary and a liquid film covers the substrate.

13. The substrate treating apparatus of claim 1, wherein the controller is configured to adjust coordinate of the laser light being irradiated by the laser based on a deviation detected by the error-identifying unit.

14. The substrate treating apparatus of claim 1, wherein the camera module and the laser light are operated to irradiate the target mark prior to substrate processing to verify a targeting deviation of the laser light by comparing an irradiated point with the target mark, and the controller stores a correction offset based on a verification result.

\*    \*    \*    \*    \*